United States Patent
Miranda Gavillan et al.

(10) Patent No.: US 10,026,455 B1
(45) Date of Patent: Jul. 17, 2018

(54) SYSTEM AND METHOD FOR CONTROLLING ENVIRONMENTAL CONDITIONS WITHIN AN AUTOMATED DATA STORAGE LIBRARY

(71) Applicant: International Business Machines Corporation, Armonk, NY (US)

(72) Inventors: Jose G. Miranda Gavillan, Tucson, AZ (US); Brian G. Goodman, Tucson, AZ (US); Gregory J. Goodman, Tucson, AZ (US); Kenny Nian Gan Qiu, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/460,479

(22) Filed: Mar. 16, 2017

(51) Int. Cl.
*G11B 33/14* (2006.01)
*G11B 5/008* (2006.01)

(52) U.S. Cl.
CPC ........ *G11B 33/144* (2013.01); *G11B 5/00813* (2013.01)

(58) Field of Classification Search
None
See application file for complete search history.

(56) References Cited

U.S. PATENT DOCUMENTS

| | | |
|---|---|---|
| 4,838,911 A | 6/1989 | Robertson et al. |
| 5,278,708 A | 1/1994 | Apple et al. |
| 5,449,229 A | 9/1995 | Aschenbrenner et al. |
| 6,366,982 B1 | 4/2002 | Suzuki et al. |
| 6,467,285 B2 | 10/2002 | Felder et al. |
| 6,478,524 B1 | 11/2002 | Malin |
| 6,537,013 B2 | 3/2003 | Emberty et al. |
| 6,563,771 B1 | 5/2003 | Debiez |
| 6,661,596 B2 | 12/2003 | Chliwnyj et al. |
| 6,676,026 B1 | 1/2004 | McKinley et al. |
| 6,676,505 B2 * | 1/2004 | Behl ............ G11B 33/02 454/184 |
| 6,854,275 B2 * | 2/2005 | Evans ............ F25B 21/02 62/3.2 |

(Continued)

FOREIGN PATENT DOCUMENTS

| | | |
|---|---|---|
| CN | 102192631 A | 9/2011 |
| CN | 102407663 A | 4/2012 |

(Continued)

OTHER PUBLICATIONS

English-machine translation of WO 2010/067443A1 published on Jun. 17, 2010 to Tanaka. (Year: 2010).*

(Continued)

*Primary Examiner* — William J Klimowicz
(74) *Attorney, Agent, or Firm* — Fox Rothschild LLP

(57) ABSTRACT

A system and method for controlling at least one environmental condition within at least one data storage library. The system may include at least one data storage library, the at least one data storage library having at least one component bay therein. The system may also include at least one adapter configured to fit within the at least one component bay, and/or at least one environmental conditioning device connected to the at least one adapter, wherein the at least one environmental conditioning device is configured to control at least one environmental condition within the at least one data storage library.

17 Claims, 15 Drawing Sheets

(56) References Cited

U.S. PATENT DOCUMENTS

| | | |
|---|---|---|
| 6,896,612 B1 | 5/2005 | Novotny |
| 6,924,981 B2 | 8/2005 | Chu et al. |
| 7,106,538 B2 | 9/2006 | Minemura et al. |
| 7,277,247 B2 | 10/2007 | Hoshino |
| 7,434,412 B1 | 10/2008 | Miyahira |
| 7,474,497 B2 | 1/2009 | Jesionowski et al. |
| 7,635,246 B2 | 12/2009 | Neeper et al. |
| 7,656,602 B2 | 2/2010 | Iben et al. |
| 7,656,660 B2 | 2/2010 | Hoeft et al. |
| 7,746,634 B2 | 6/2010 | Hom et al. |
| 7,751,188 B1 | 7/2010 | French et al. |
| 7,961,419 B2 | 6/2011 | Suzuki et al. |
| 8,051,671 B2 | 11/2011 | Vinson et al. |
| 8,151,046 B2 | 4/2012 | Suzuki et al. |
| 8,206,976 B2 | 6/2012 | Kobayashi et al. |
| 8,210,914 B2 | 7/2012 | McMahan et al. |
| 8,514,513 B2 | 8/2013 | Hori |
| 8,544,289 B2 | 10/2013 | Johnson et al. |
| 8,675,303 B2 | 3/2014 | Compton et al. |
| 8,694,152 B2 | 4/2014 | Cyrulik et al. |
| 8,789,384 B2 | 7/2014 | Eckberg et al. |
| 8,849,784 B2 | 9/2014 | Alber et al. |
| 8,857,208 B2 | 10/2014 | Malin |
| 8,939,524 B2 | 1/2015 | Gasser |
| 8,974,274 B2 | 3/2015 | Carlson |
| 9,025,275 B1 | 5/2015 | Manes et al. |
| 9,069,534 B2 | 6/2015 | Rogers |
| 9,110,641 B2 | 8/2015 | Wu |
| 9,155,230 B2 | 10/2015 | Eriksen |
| 9,190,112 B1 | 11/2015 | Bayang et al. |
| 9,240,209 B1 | 1/2016 | Crawford et al. |
| 9,255,936 B2 | 2/2016 | Hunt et al. |
| 9,291,408 B2 | 3/2016 | Iyengar et al. |
| 9,321,136 B2 | 4/2016 | Eckberg et al. |
| 9,361,921 B2 | 6/2016 | Herget |
| 9,368,148 B2 | 6/2016 | Starr et al. |
| 9,433,122 B2 | 8/2016 | Ohba et al. |
| 2002/0098064 A1 | 7/2002 | Ostwald et al. |
| 2003/0039056 A1 | 2/2003 | Satoh |
| 2003/0197619 A1 | 10/2003 | Lawrence et al. |
| 2004/0145468 A1 | 7/2004 | La et al. |
| 2004/0153386 A1 | 8/2004 | Eckerdt |
| 2004/0165358 A1 | 8/2004 | Regimbal et al. |
| 2005/0185323 A1 | 8/2005 | Brace et al. |
| 2005/0270727 A1 | 12/2005 | Shih |
| 2006/0177922 A1 | 8/2006 | Shamah et al. |
| 2006/0250578 A1 | 11/2006 | Pohl et al. |
| 2007/0250410 A1 | 10/2007 | Brignone et al. |
| 2008/0151491 A1 | 6/2008 | Baldwin et al. |
| 2009/0046427 A1 | 2/2009 | Noteboom et al. |
| 2009/0266511 A1 | 10/2009 | Yang |
| 2010/0188810 A1 | 7/2010 | Andersen et al. |
| 2010/0254241 A1 | 10/2010 | Aoki |
| 2011/0108207 A1 | 5/2011 | Mainers et al. |
| 2011/0231007 A1 | 9/2011 | Biehle et al. |
| 2013/0031928 A1 | 2/2013 | Kim |
| 2013/0088833 A1 | 4/2013 | Cox et al. |
| 2013/0128455 A1 | 5/2013 | Koblenz et al. |
| 2014/0059946 A1 | 3/2014 | Gardner et al. |
| 2014/0206271 A1 | 7/2014 | Ignacio |
| 2014/0238639 A1 | 8/2014 | Ambriz et al. |
| 2014/0277765 A1 | 9/2014 | Karimi et al. |
| 2014/0293471 A1 | 10/2014 | Sakuma |
| 2015/0036293 A1 | 2/2015 | Martini |
| 2015/0088319 A1 | 3/2015 | Dasari et al. |
| 2015/0167996 A1 | 6/2015 | Fadell et al. |
| 2015/0179210 A1 | 6/2015 | Ostwald et al. |
| 2015/0203297 A1 | 7/2015 | Manning et al. |
| 2016/0094898 A1 | 3/2016 | Primm et al. |
| 2016/0107312 A1 | 4/2016 | Morrill et al. |
| 2016/0112245 A1 | 4/2016 | Mankovskii |
| 2016/0117126 A1 | 4/2016 | De Spiegeleer et al. |
| 2016/0240061 A1 | 8/2016 | Li et al. |
| 2017/0154483 A1 | 6/2017 | Cordiner et al. |

FOREIGN PATENT DOCUMENTS

| | | | |
|---|---|---|---|
| CN | 102881313 A | | 1/2013 |
| CN | 204361533 U | | 5/2015 |
| JP | 2001307474 A | * | 11/2001 |
| JP | 2009087518 A | | 4/2009 |
| JP | 2011191207 A | | 9/2011 |
| WO | 2007099542 A2 | | 9/2007 |
| WO | 2008014578 A1 | | 2/2008 |
| WO | 2009134610 A2 | | 11/2009 |
| WO | WO-2010067443 A1 | * | 6/2010 ......... G11B 15/6835 |

OTHER PUBLICATIONS

Hanaoka Y. et al., "Technologies for Realizing New ETERNUS LT270 High-End Tape Library System", FUJITSU Sci. Tech. J., 42.1, pp. 24-31, Jan. 2006.

McCormick-Goodhart M. et al, "The Design and Operation of a Passive Humidity-Controlled Cold Storage Vault Using Conventional Freezer Technology and Moisture-Sealed Cabinets", IS&T's 2004 Archiving Conference, Apr. 20-23, 2005, San Antonio, Texas.

Frachtenberg E. et al., "Thermal Design in the Open Compute Datacenter", Thermal and Thermomechanical Phenomena in Electronic Systems (ITherm), 13th IEEE I22012.

Oga, S. et al., "Indirect External Air Cooling Type Energy-Saving Hybrid Air Conditioner for Data Centers, "F-COOL NEO"", Fuji Electric Review, vol. 60, No. 1, Mar. 30, 2014, pp. 59-64.

Lee, S. et al., "Thermoelectric-based Sustainable Self-Cooling for Fine-Grained Processor Hot Spots", 15th IEEE Therm Conference, May 31-Jun. 3, 2016, pp. 847-856.

Disclosed Anonymously, ip.com, "Method for a Direct Air Free Cooling with a real time hygrometry regulation for Data Center", IPCOM000200312D, Oct. 5, 2010, pp. 1-3.

Rasmussen N., "Cooling Options for Rack Equipment with Side-to-Side Airflow", www.apc.com, 2004.

Ouchi M. et al., "Thermal Management Systems for Data Centers with Liquid Cooling Technique of CPU", ITherm IEEE 13th Intersociety Conference, May 30-Jun. 1, 2012, pp. 790-798.

Authors: IBM, "Energy Efficient Cooling System for Data Center", IPCOM000182040D, Apr. 23, 2009, pp. 1-4.

Ernest S. Gale et al., U.S. Appl. No. 15/460,389, filed Mar. 16, 2017.
Ernest S. Gale et al., U.S. Appl. No. 15/460,397, filed Mar. 16, 2017.
Ernest S. Gale et al., U.S. Appl. No. 15/460,403, filed Mar. 16, 2017.
Ernest S. Gale et al., U.S. Appl. No. 15/460,420, filed Mar. 16, 2017.
Jose G. Miranda Gavillan et al., U.S. Appl. No. 15/460,345, filed Mar. 16, 2017.
Jose G. Miranda Gavillan et al., U.S. Appl. No. 15/460,357, filed Mar. 16, 2017.
Jose G. Miranda Gavillan et al., U.S. Appl. No. 15/460,379, filed Mar. 16, 2017.
Jose G. Miranda Gavillan et al., U.S. Appl. No. 15/460,402, filed Mar. 16, 2017.
Jose G. Miranda Gavillan et al., U.S. Appl. No. 15/460,423, filed Mar. 16, 2017.
Jose G. Miranda Gavillan et al., U.S. Appl. No. 15/460,441, filed Mar. 16, 2017.
Jose G. Miranda Gavillan et al., U.S. Appl. No. 15/460,456, filed Mar. 16, 2017.
Jose G. Miranda Gavillan et al., U.S. Appl. No. 15/460,472, filed Mar. 16, 2017.
Jose G. Miranda Gavillan et al., U.S. Appl. No. 15/460,479, filed Mar. 16, 2017.
Jose G. Miranda Gavillan et al., U.S. Appl. No. 15/460,429, filed Mar. 16, 2017.
Jose G. Miranda Gavillan et al., U.S. Appl. No. 15/460,439, filed Mar. 16, 2017.
Ernest S. Gale et al., U.S. Appl. No. 15/460,497, filed Mar. 16, 2017.

* cited by examiner

SYSTEM AND METHOD FOR CONTROLLING ENVIRONMENTAL CONDITIONS WITHIN AN AUTOMATED DATA STORAGE LIBRARY

BACKGROUND

The present disclosure relates to a data storage library for the storage and data transfer of data storage media, and more specifically, to a system for controlling the environmental conditions within a data storage library.

Automated data storage libraries are known for providing cost effective storage and retrieval of large quantities of data. The data in automated data storage libraries is typically stored on media of data storage cartridges that are, in turn, stored at storage slots or the like inside the library in a fashion that renders the media, and its resident data, accessible for physical retrieval. Such data storage cartridges are commonly termed "removable media." Data storage cartridge media may comprise any type of media on which data may be stored and which may serve as removable media, including but not limited to magnetic media (such as magnetic tape or disks), optical media (such as optical tape or disks), electronic media (such as PROM, EEPROM, flash PROM, COMPACTFLASH™, SMARTMEDIA™, MEMORY STICK™, etc.), or other suitable media. An example of a data storage cartridge that is widely employed in automated data storage libraries for mass data storage is a magnetic tape cartridge.

In addition to data storage media, automated data storage libraries typically comprise data storage drives that store data to, and/or retrieve data from, the data storage cartridge media. Further, automated data storage libraries typically comprise I/O stations at which data storage cartridges are supplied or added to, or removed from, the library. The transport of data storage cartridges between data storage slots, data storage drives, and I/O stations is typically accomplished by one or more robotic accessors. Such accessors have grippers for physically retrieving the selected data storage cartridges from the storage slots within the automated data storage library and transporting such cartridges to the data storage drives by moving, for example, in the horizontal (X) and vertical (Y) directions.

In an effort to increase storage capacity, deep slot technology allows for storage cells that contain more than a single data storage cartridge. Such storage libraries allow for higher density, or more cartridges stored per square foot. In "deep slot" libraries, two or more cartridges may be stored in a multi-cartridge deep slot cell, arrayed in series, one behind the other, in tiers ranging from a front-most tier to a rearmost tier

SUMMARY

In accordance with an aspect of the disclosure, a system for controlling at least one environmental condition within a data storage library is disclosed. The system includes a data storage library, wherein the data storage library comprises at least one component bay therein. The system also includes at least one duct adapter configured to fit within the at least one component bay, and at least one environmental conditioning unit fluidly connected to the at least one duct adapter via at least one duct, wherein the at least one environmental conditioning unit is configured to control at least one environmental condition within the data storage library.

In accordance with another aspect of the disclosure, a system for controlling at least one environmental condition within a data storage library is disclosed. The system includes at least one data storage library, wherein the at least one data storage library comprises at least one component bay therein. The system also includes at least one adapter configured to fit within the at least one component bay, and at least one environmental conditioning device connected to the at least one adapter, wherein the at least one environmental conditioning device is configured to control at least one environmental condition within the at least one data storage library.

According to another aspect of the disclosure, a method of controlling at least one environmental condition within a data storage library is disclosed, the method including providing at least one adapter within at least one component bay of the data storage library, and connecting at least one of an external environmental conditioning unit and an external environmental conditioning device to the at least one adapter. The method also includes providing conditioned air from the at least one adapter into an interior of the data storage library.

DETAILED DESCRIPTION

Figure 1:
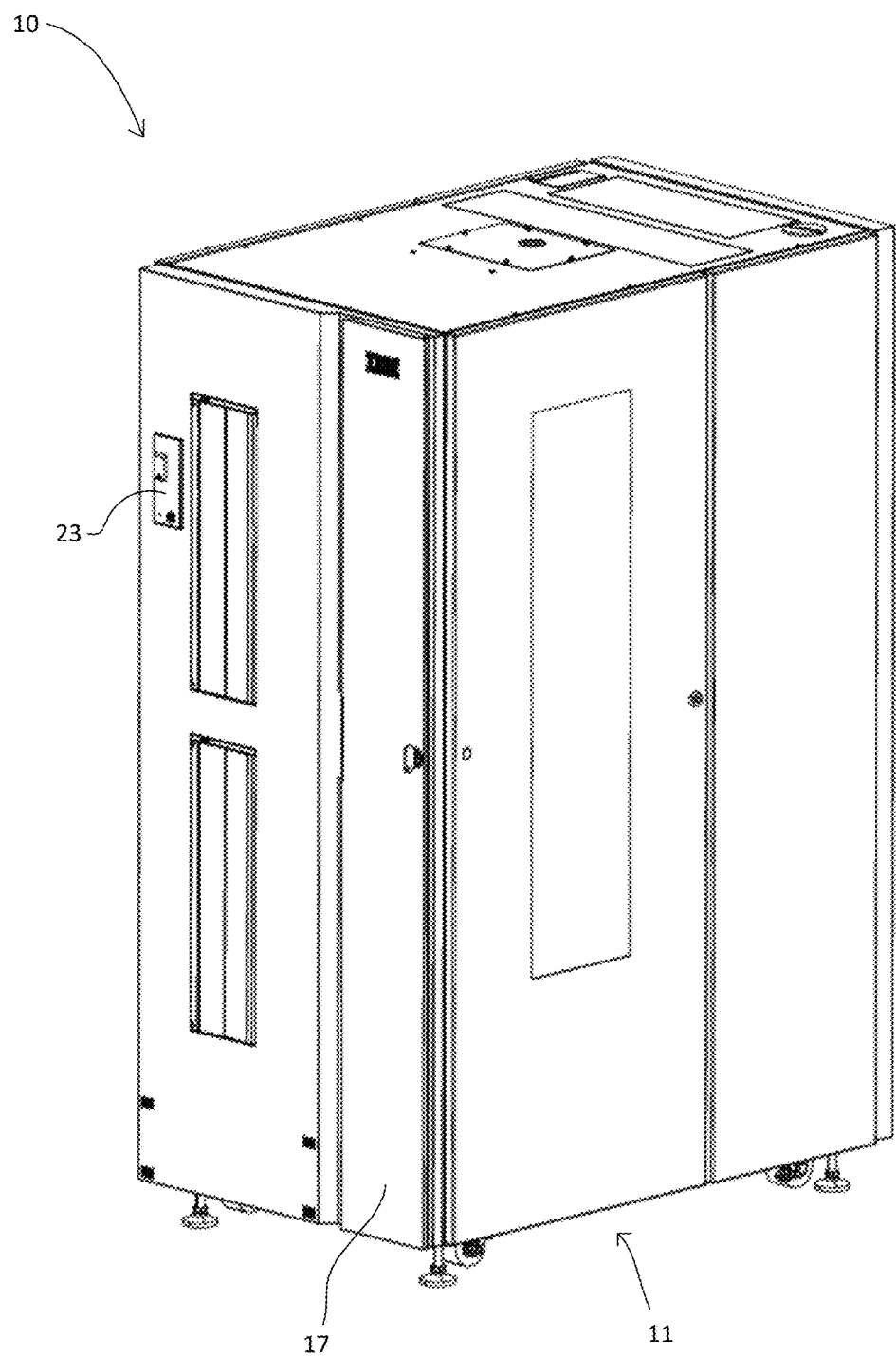
FIG. 1 is a perspective view of an automated data storage library according to one aspect.

The following description is made for the purpose of illustrating the general principles of the present disclosure and is not meant to limit the inventive concepts claimed herein. Further, particular features described herein can be used singularly and/or in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

Efforts to improve the performance of traditional data centers attempt to minimize the cost of processing and storing data. One option that is employed to reduce operational costs of datacenters is to run the equipment in the datacenter at the high end of its environmental operational limits, thereby allowing for cooling of the datacenter to be reduced. In other words, datacenters are running increasingly hot and more humid conditions than traditional datacenters in an attempt to reduce operating costs. Although this strategy may be effective when applied to disk and/or flash data storage environments, magnetic tape may be more susceptible to degradation when exposed to these unfavorable conditions. Therefore, this option may not be available for magnetic tape libraries.

In an effort to control the environment within data storage libraries so as to provide suitable working conditions for magnetic tape media, data storage drives, etc., environmental conditioning units may be incorporated into (or on) the data storage libraries themselves. However, some data storage libraries may be too small to incorporate an integrated environmental conditioning unit and/or may not be large enough to justify an integrated environmental conditioning unit. Furthermore, incorporation of an environmental conditioning unit also may involve significant engineering and/or alterations to the data storage library in order to properly mount the environmental conditioning unit, substantially seal the data storage library, drain condensation produced by the environmental conditioning unit, etc. Herein, controlling an environmental condition refers to altering an environmental condition for the purpose of providing a more favorable environmental condition than if no alteration were performed. For example, providing a cooler environment wherein without the cooling undesirable system operation or performance may be observed. Herein, environmental condition refers to an environmental parameter. For example, temperature (e.g., heat, cold, etc.), humidity (e.g., moisture content), ionization (e.g., electrically charged air molecules), contaminants (e.g., smoke, flammable gasses or vapors, etc.), particulates (e.g., dust, debris), composition (e.g., air gas composition), etc.

Figure 2:
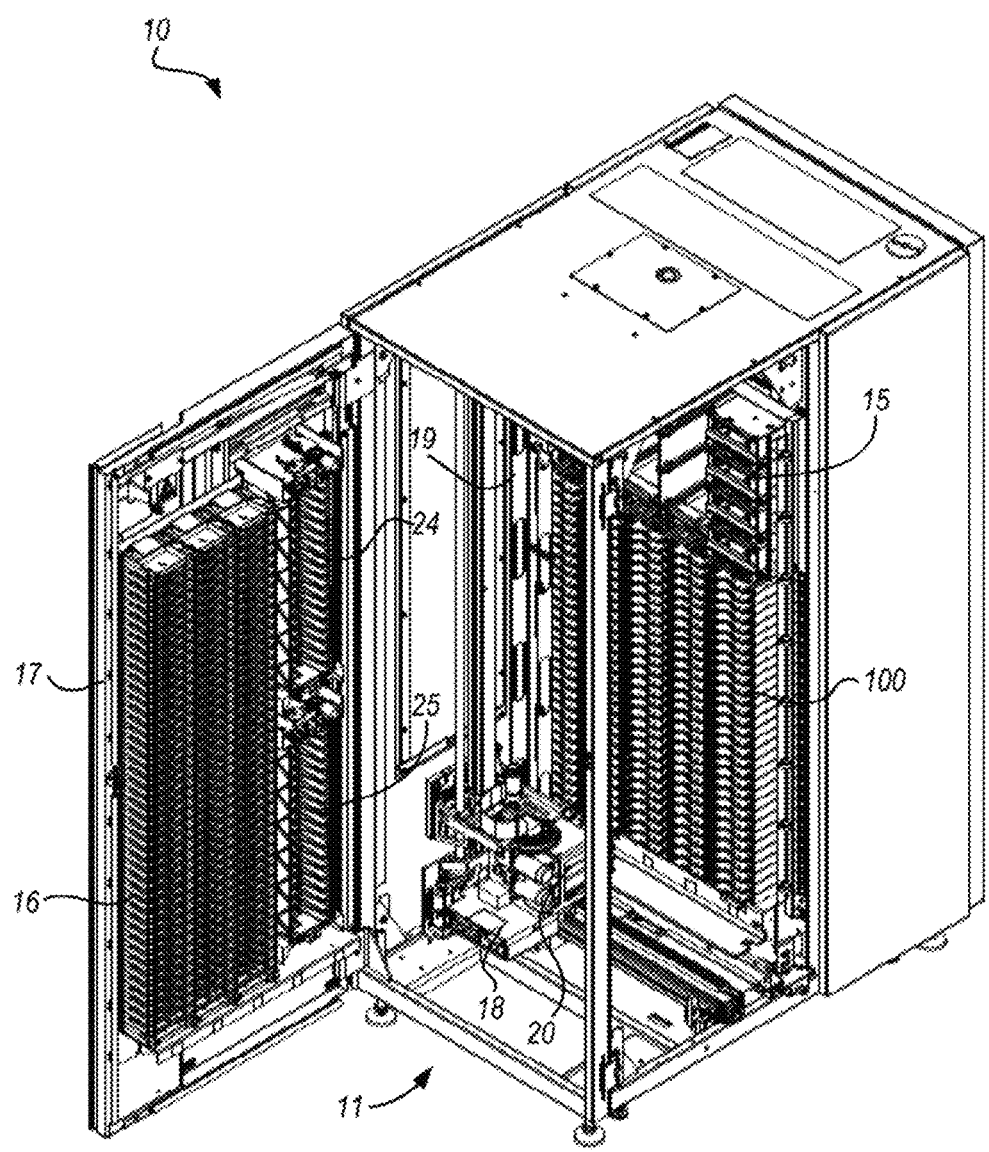
FIG. 2 is a perspective view of the front interior portion of a storage frame from the data storage library of FIG. 1.
Figure 3:
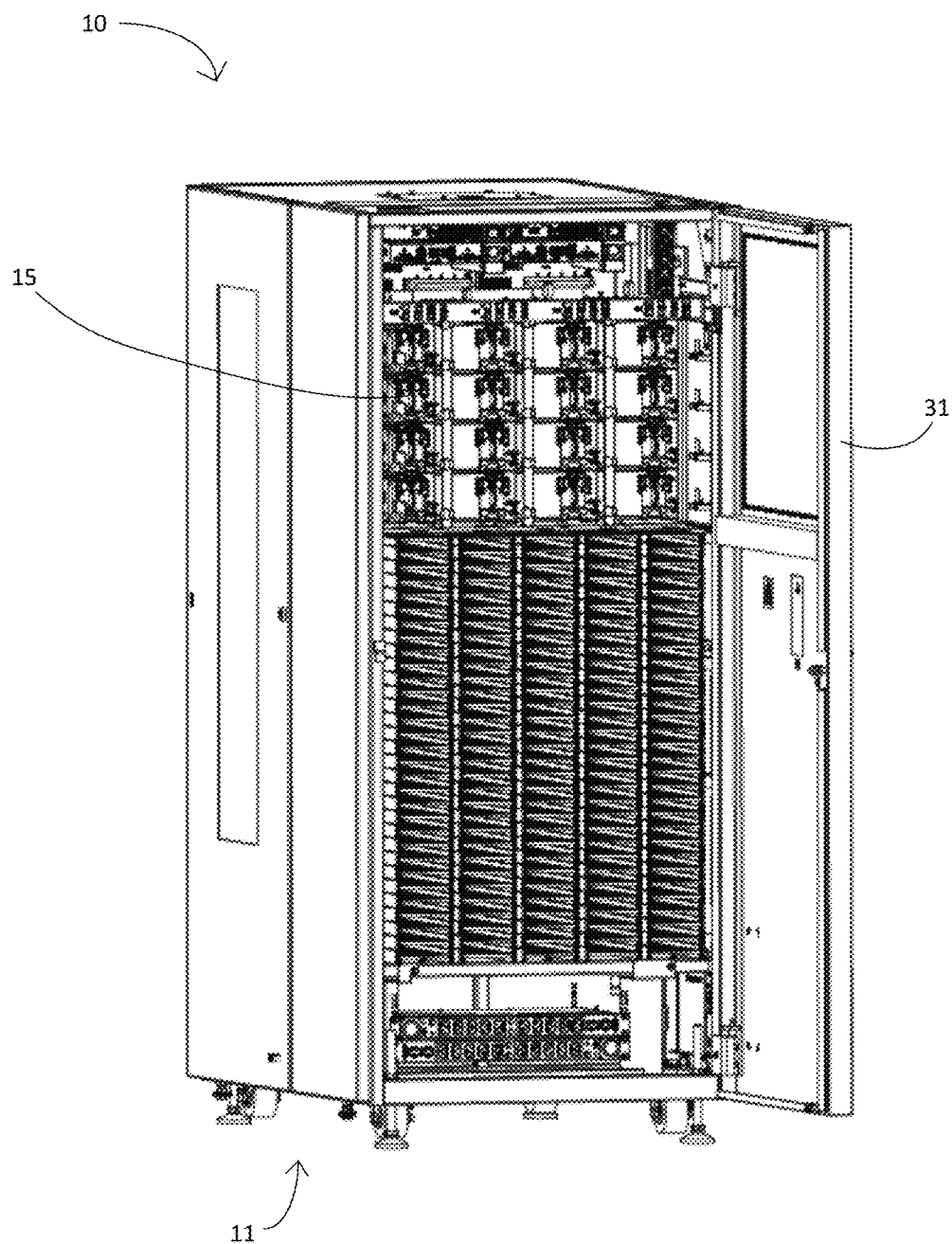
FIG. 3 is a perspective view of a rear interior portion of a storage frame from the data storage library of FIG. 1.
Figure 4:
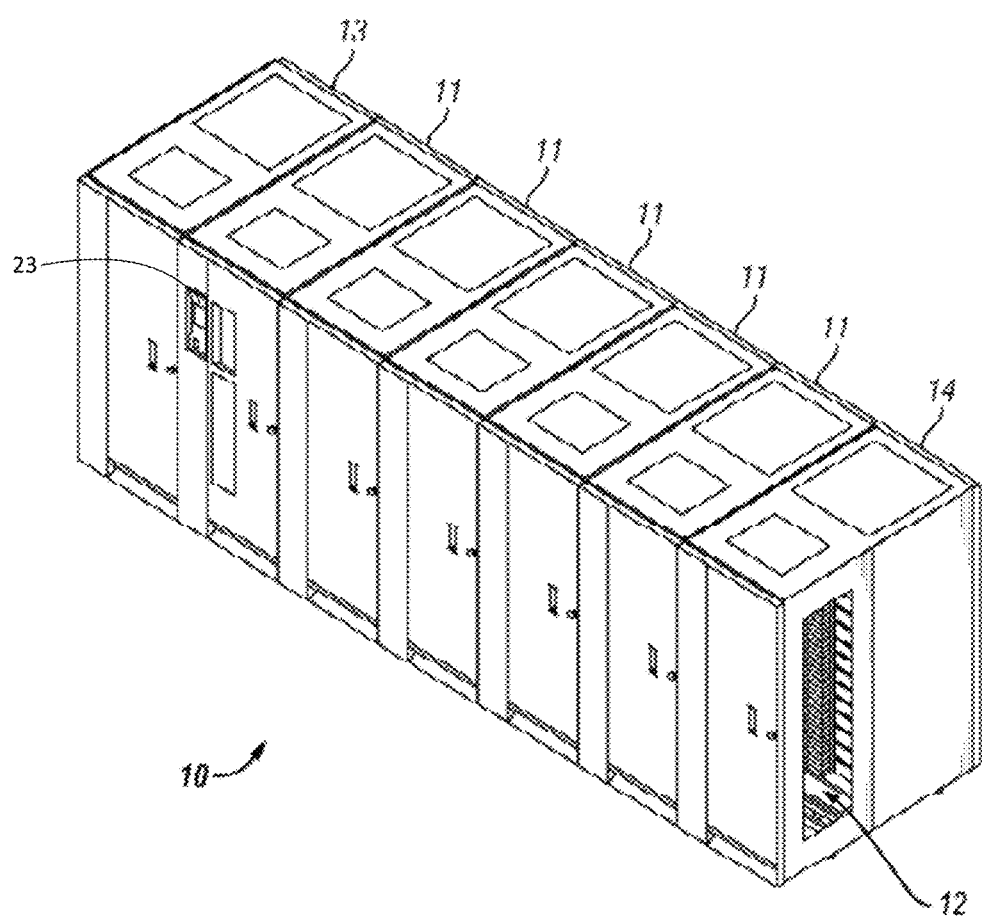
FIG. 4 is a perspective view of an automated data storage library according to another aspect.

FIGS. 1-4 illustrate an example of a data storage system, e.g., an automated data storage library 10 which stores and retrieves data storage cartridges, containing data storage media (not shown), from multi-cartridge deep slot storage cells 100 and single cartridge storage slots 16 (shown in FIG. 2). Examples of an automated data storage library which has a similar configuration as that depicted in FIGS. 1-3, and may be implemented with some of the various approaches herein may include IBM TS4500 Tape Library or the IBM TS3500 Tape Library. The library 10 may comprise a single frame 11 (as shown in FIGS. 1-3) or multiple frames (as shown in FIG. 4).

The library 10 in the embodiment of FIG. 4 comprises a left hand service bay 13, one or more storage frames 11, and right hand service bay 14. A frame may comprise an expansion component of the library. Thus, storage frames may be added or removed to expand or reduce the size and/or functionality of the library. According to different approaches, frames may include additional storage slots, deep storage slot cells, drives, import/export stations, accessors, operator panels, controller cards, communication cards, etc. Moreover, an accessor aisle 12 preferably extends between the storage frames and bays of the embodiment in FIG. 4, thereby allowing an accessor to move between frames. Herein, frame may refer to an expansion component of a library, an expandable library and/or a non-expandable library.

FIGS. 1-3 show an exemplary embodiment of a storage frame 11, which may act as the base frame of the library 10. The storage frame 11 as illustrated in FIG. 2 may have only a single accessor 18 (i.e., there are no redundant accessors) and no service bay. However, in other embodiments, a storage frame may include multiple robotic accessors and/or service bays.

Looking to FIG. 2, the library 10 is arranged for accessing data storage media in response to commands from at least one external host system (not shown). The library 10 includes a plurality of storage slots 16 on front door 17 and a plurality of multi-cartridge deep slot cells 100 on rear wall 19, both of which may be used for storing data storage cartridges that may contain data storage media. According to one approach, the storage slots 16 are configured to store a single data storage cartridge, and the multi-cartridge deep slot cells 100 are configured to store a plurality of data storage cartridges. The arrangement and positioning of the storage slots 16 and the deep slot cells 100 may be different than illustrated in FIG. 2.

With continued reference to FIG. 2, the storage frame 11 of the library 10 also includes at least one data storage drive 15, e.g., for reading and/or writing data with respect to the data storage media in the data storage cartridges. Additionally, a first accessor 18 may be used to transport data storage cartridges containing data storage media between the plurality of storage slots 16, the multi-cartridge deep slot cells 100, and/or the data storage drive(s) 15. According to various approaches, the data storage drives 15 may be optical disk drives, magnetic tape drives, or other types of data storage drives that are used to read and/or write data with respect to the data storage media.

Figure 7:
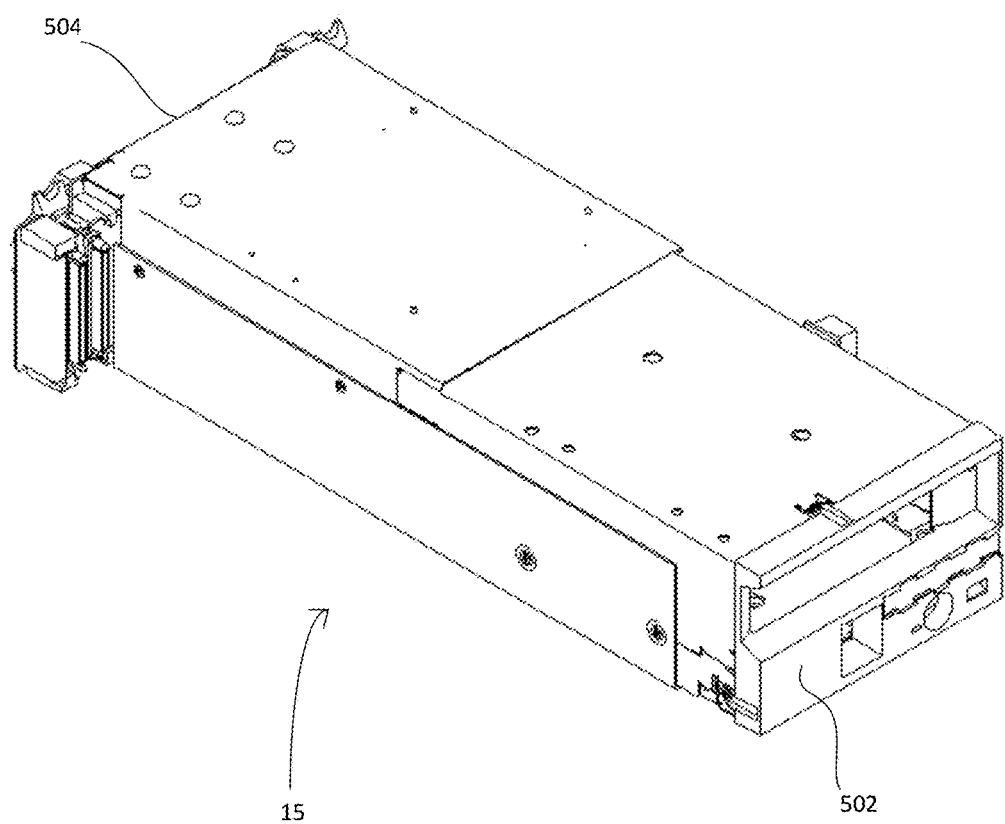
FIG. 7 is a perspective view of a data storage drive according to one aspect.

Referring to FIG. 3, a rear perspective view of storage frame 11 of the library 10 is illustrated. A rear panel or door 31 may be selectively openable in order to access components within the library, such as one or more power supplies, deep slot cells, data storage drives, etc. As shown in FIG. 3, at least one data storage drive 15 is accessible from the rear of storage frame 11. Accordingly, the at least one data storage drive 15 extends at least partially through storage frame 11 such that a first end of a data storage drive 15 is accessible from a front interior portion of frame 11 (as shown in FIG. 2), while a second end of the data storage drive 15 is accessible from a rear portion of frame 11 (as shown in FIG. 3). For example, referring to FIG. 7, data storage drive 15 is shown having a first end 502 and a second end 504. When installed within frame 11, first end 502 may be accessible and communicate with the interior of the data storage library (as shown in FIG. 2), while second end 504 may be accessible and communicate with a rear portion of the data storage library (as shown in FIG. 3). Furthermore, while not shown in FIG. 3, it is to be understood that rear door 31 may have one or more access panels or openings therein so as to selectively enable access to one or more components within frame 11 without the need to open rear door 31. The data storage drive 15 shown in FIG. 7 depicts a drive brick (e.g., a bare drive) mounted in a hot-swap drive canister. However, the drive bay of an automated data storage library may hold one or more drive bricks, one or more drive bricks installed in one or more sleds (e.g., a drive brick mounted on rails, on a plate, on a frame, etc.), one or more drive bricks installed in one or more drive canisters (e.g., a drive brick mounted inside a housing, container, enclosure, etc.), or other methods of packaging data storage drive bricks. Herein, a drive may refer to any form of drive and/or drive assembly that may occupy a drive bay.

As illustrated, the storage frame 11 may optionally include an operator panel 23 or other user interface, such as a web-based interface, which allows a user to interact with the library 10. Optionally, the library 10 may have an associated software application having a user interface, which also allows a user to interact with the library 10. The software application may be executable on a computing device, a remote server, a cloud or a mobile device.

Figure 5:
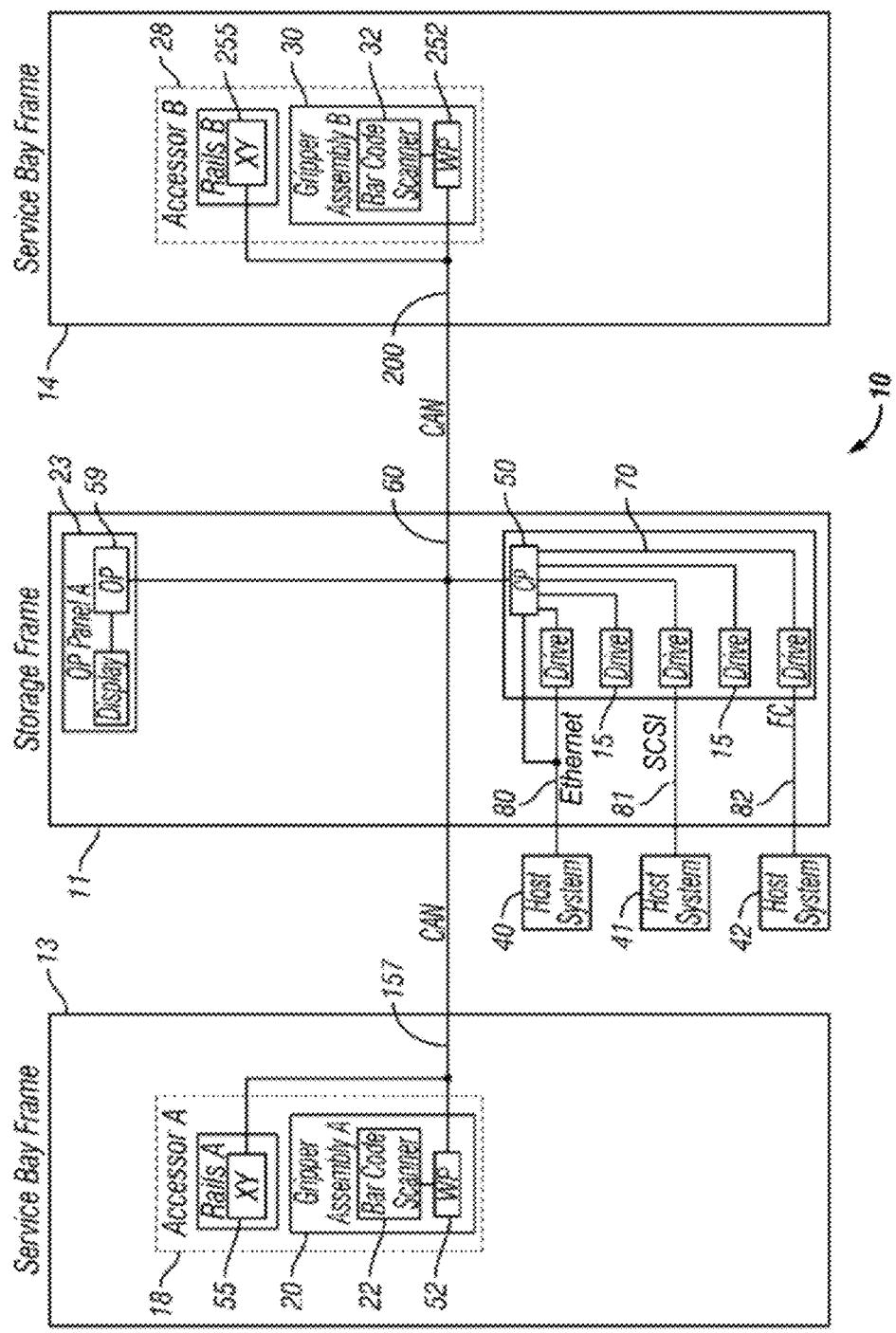
FIG. 5 is a schematic diagram of an automated data storage library according to one aspect.

Referring now to FIG. 5, the automated data storage library 10 as described in reference to FIGS. 1-4, is depicted according to one embodiment. According to a preferred approach, the library 10 may employ a controller, e.g., arranged as a distributed system of modules with a plurality of processor nodes.

In one approach, the library is controlled, not by a central controller, but rather, by a distributed control system for receiving logical commands and converting the commands to physical movements of the accessor and gripper, and for operating the drives in accordance with the desired physical movements. The distributed control system may also provide logistical support, such as responding to host requests for element status, inventory, library status, etc. The specific commands, the conversion of those commands to physical movements of the accessor, gripper, controllers, and other components, and the operation of the drives may be of a type known to those of skill in the art.

While the automated data storage library 10 has been described as employing a distributed control system, various other approaches described and/or suggested herein may be implemented in automated data storage libraries regardless of control configuration, such as, but not limited to, an automated data storage library having one or more library controllers that are not distributed.

With continued reference to FIG. 5, library 10 receives commands from one or more host systems 40, 41, 42. The host systems 40, 41, 42, such as host servers, communicate with the library directly, e.g., on line 80 (e.g., path), through one or more control ports (not shown), or through one or more data storage drives 15 on paths 81, 82. Thus, in different approaches, the host systems 40, 41, 42 may provide commands to access particular data storage cartridges and move the cartridges, for example, between the storage slots 16, the deep slot cells 100, and the data storage drives 15. The commands are typically logical commands identifying the data storage cartridges or data storage cartridge media, and/or logical locations for accessing the media. Furthermore, it should be noted that the terms "commands" and "work requests" are used interchangeably herein to refer to such communications from the host system 40, 41, 42 to the library 10 as are intended to result in accessing particular data storage media within the library 10 depending on the desired approach.

According to one embodiment, the library 10 may be controlled by a library controller. Moreover, in various approaches, the library controller may include a distributed control system receiving the logical commands from hosts, determining the required actions, and/or converting the actions to physical movements of the first and/or second accessors 18, 28 and/or gripper assemblies 20, 30. In another approach, the distributed control system may have a plurality of processor nodes, each having one or more computer processors. According to one example of a distributed control system, a communication processor node 50 may be located in a storage frame 11. The communication processor node provides a communication link for receiving the host commands, either directly or through the drives 15, via at least one external interface, e.g., coupled to line 80.

As illustrated in FIG. 5, the communication processor node 50 is coupled to each of the data storage drives 15 of a storage frame 11, via lines 70, and may communicate with the drives 15 and with host systems 40, 41, 42. Alternatively, the host systems 40, 41, 42 may be directly coupled to the communication processor node 50, at line 80 (e.g., input) for example, or to control port devices (not shown) which connect the library to the host system(s) with a library interface similar to the drive/library interface. As is known to those of skill in the art, various communication arrangements may be employed for communication with the hosts and with the data storage drives. In the example of FIG. 5, lines 80 and 81 are intended to be Ethernet and a SCSI bus, respectively, and may serve as host connections. However, path 82 comprises an example of a Fibre Channel bus which is a high speed serial data interface, allowing transmission over greater distances than the SCSI bus systems.

According to some approaches, the data storage drives 15 may be in close proximity to the communication processor node 50, and may employ a short distance communication scheme, such as Ethernet, or a serial connection, such as RS-422. Thus, the data storage drives 15 may be individually coupled to the communication processor node 50 by lines 70. Alternatively, the data storage drives 15 may be coupled to the communication processor node 50 through one or more networks.

Furthermore, additional storage frames 11 may be provided, whereby each is preferably coupled to the adjacent storage frame. According to various approaches, any of the additional storage frames 11 may include communication processor nodes 50, storage slots 16, storage cells 100, data storage drives 15, networks 60, etc.

An automated data storage library 10 typically comprises one or more controllers to direct the operation of the automated data storage library. Moreover, host computers and data storage drives typically include similar controllers. A library controller may take many different forms and may comprise, for example, but is not limited to, an embedded system, a distributed control system, a personal computer, a workstation, etc. The term "library controller" as used herein is intended in its broadest sense as a device that includes at least one processor, and optionally further circuitry and/or logic, for controlling and/or providing at least some aspects of library operations.

Figure 6:
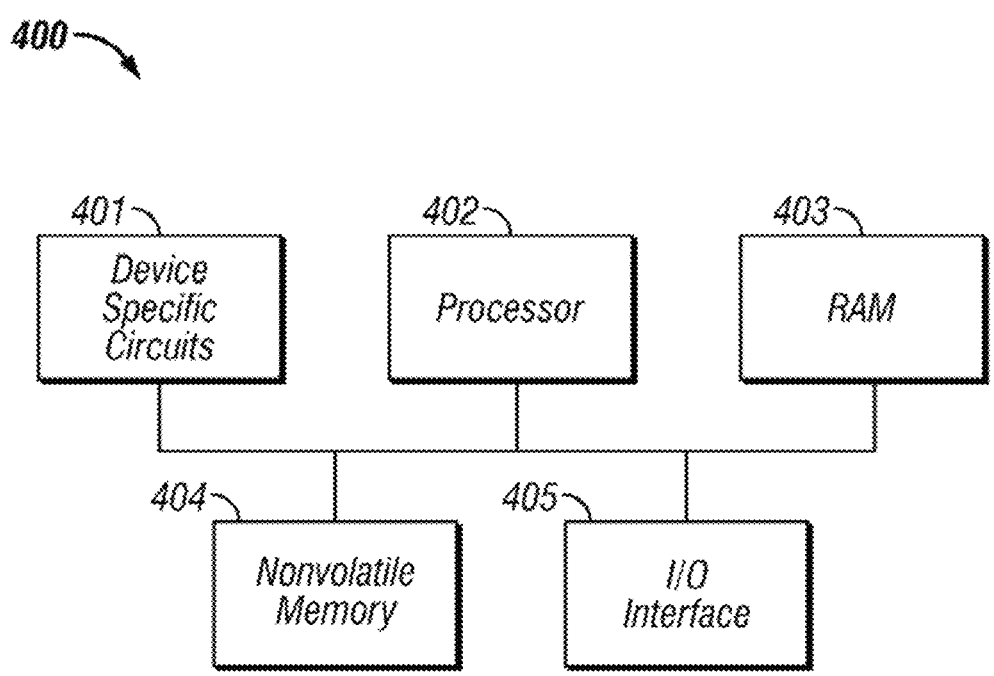
FIG. 6 is a block diagram depicting a controller configuration according to one aspect.

Referring now to FIG. 6, a typical controller 400 is shown with a processor 402, Random Access Memory (RAM) 403, nonvolatile memory 404, device specific circuits 401, and I/O interface 405. Alternatively, the RAM 403 and/or nonvolatile memory 404 may be contained in the processor 402 as could the device specific circuits 401 and I/O interface 405. The processor 402 may comprise, for example, an off-the-shelf microprocessor, custom processor, Field Programmable Gate Array (FPGA), Application Specific Integrated Circuit (ASIC), discrete logic, etc. The RAM 403 is typically used to hold variable data, stack data, executable instructions, etc.

According to various approaches, the nonvolatile memory 404 may comprise any type of nonvolatile memory such as, but not limited to, Electrically Erasable Programmable Read Only Memory (EEPROM), flash Programmable Read Only Memory (PROM), battery backup RAM, hard disk drives, etc. However, the nonvolatile memory 404 is typically used to hold the executable firmware and any nonvolatile data containing programming instructions that can be executed to cause the processor 402 to perform certain functions.

In some embodiments, the I/O interface 405 may include a communication interface that allows the processor 402 to communicate with devices external to the controller. Examples of the communication interface may comprise, but are not limited to, serial interfaces such as RS-232, USB (Universal Serial Bus), Small Computer Systems Interface (SCSI), RS-422 or a wireless communication interface such as Wi-Fi, Bluetooth, near-field communication (NFC) or other wireless interfaces. The controller 400 may communicate with an external device via the communication interface 405 in any communication protocols such as Automation/Drive Interface (ADI).

The device specific circuits 401 provide additional hardware to enable the controller 400 to perform unique functions including, but not limited to, motor control of an accessor cartridge gripper. Moreover, the device specific circuits 401 may include electronics that provide, by way of example but not limitation, Pulse Width Modulation (PWM) control, Analog to Digital Conversion (ADC), Digital to Analog Conversion (DAC), etc. In addition, all or part of the device specific circuits 401 may reside outside the controller 400.

While the automated data storage library 10 is described as employing a distributed control system, the various approaches described and/or suggested herein may be implemented in various automated data storage libraries regardless of control configuration, including, but not limited to, an automated data storage library having one or more library controllers that are not distributed. Moreover, a library controller may comprise one or more dedicated controllers of a library, depending on the desired embodiment. For example, there may be a primary controller and a backup controller. In addition, a library controller may comprise one or more processor nodes of a distributed control system. According to one example, communication processor node 50 (e.g., of FIG. 5) may comprise the library controller while the other processor nodes (if present) may assist the library controller and/or may provide backup or redundant functionality. In another example, communication processor node 50 and work processor node 52 may work cooperatively to form the library controller while the other processor nodes (if present) may assist the library controller and/or may provide backup or redundant functionality. Still further, all of the processor nodes may comprise the library controller. According to various approaches described and/or suggested herein, a library controller may have a single processor or controller, or it may include multiple processors or controllers, or multiple cores in a processor chip.

As noted above, efforts have previously been made to minimize the cost of processing and storing data in traditional data centers, particularly with respect to the environmental conditions within the data center. For example, equipment within data centers has been run at the upper end of its environmental operational limits in order to reduce the temperature and/or humidity regulation costs throughout the data center. However, operating at or near such operational limits may not be desirable in magnetic tape libraries, as magnetic tape (and/or other data storage library components) may be more susceptible to degradation at such extremes. Furthermore, environmentally controlling the entire data center in which the data storage libraries are housed may be cost prohibitive and/or difficult to maintain over time. Also, while providing each data storage library with an integrated environmental conditioning unit is an option in certain situations, some data storage libraries may be too small to incorporate an integrated environmental conditioning unit and/or may not be large enough to justify an integrated environmental conditioning unit. Furthermore, incorporation of an environmental conditioning unit also may involve significant engineering and/or alterations to the data storage library in order to properly mount the environmental conditioning unit, substantially seal the data storage library, drain condensation produced by the environmental conditioning unit, etc.

Thus, in accordance with aspects of the disclosure, an apparatus, for example one or more duct adapters, may be provided in order to deliver conditioned air into the data storage library. In some aspects, the duct adapter(s) may be fluidly connected to an associated environmental conditioning unit (e.g., an air conditioning unit), which may deliver conditioned air directly into the data storage library. In other aspects, an environmental conditioning unit may be at least partially integrated into the duct adapter(s) so as to provide environmentally conditioned air directly into the data storage library. In this way, the environmental conditions within the interior of the data storage library may be controlled without the need for an integrated environmental conditioning unit originally designed into or retrofitted onto the data storage library itself. The duct adapter (or adapters) may be fabricated and configured to fit into a conventional library component bay, such as a drive bay, power supply bay, library controller bay, optional component bay, or any other suitable location within the data storage library that is equipped to house components of the library.

Figure 8:
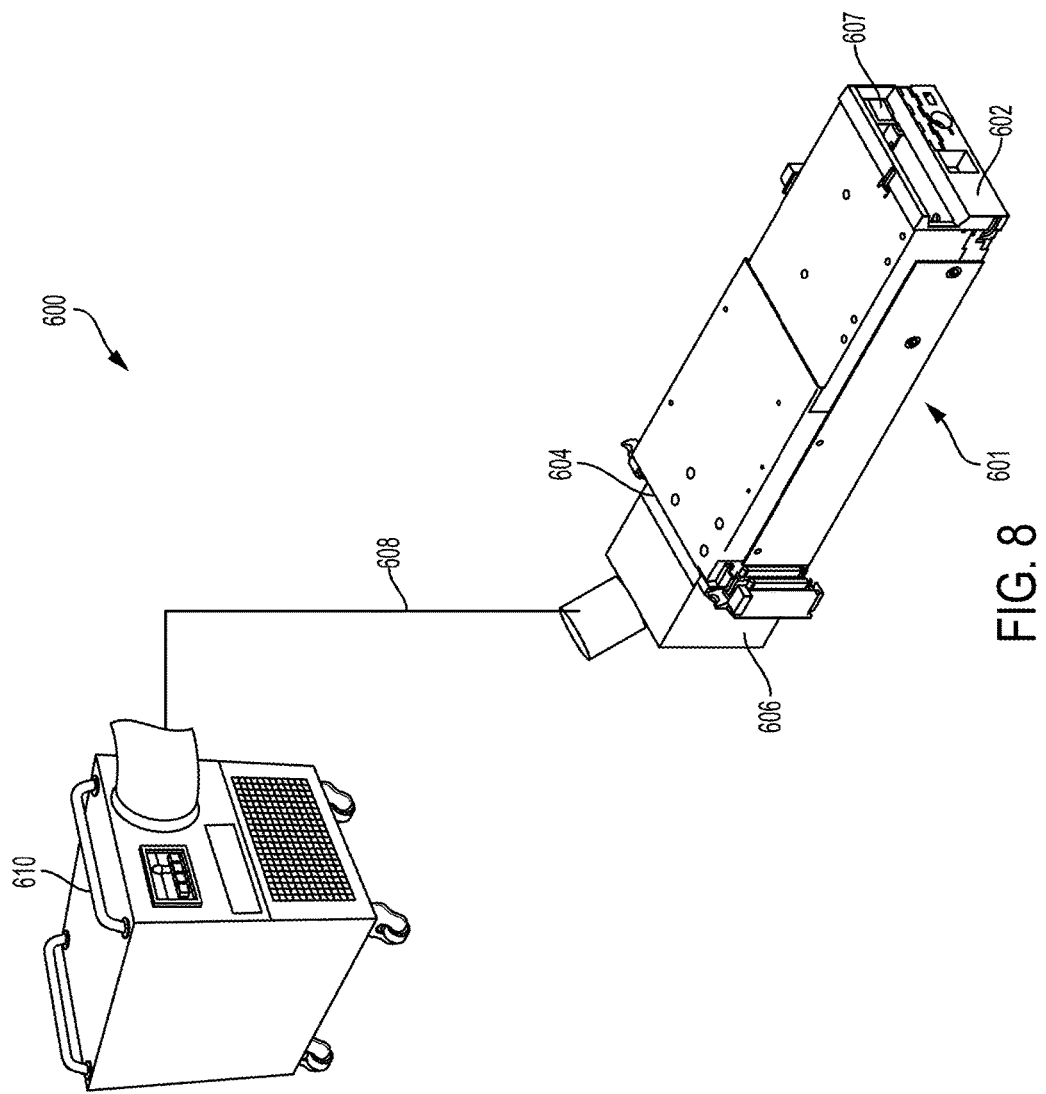
FIG. 8 is a perspective view of an environmental conditioning system for a data storage library in accordance with one aspect.

Referring to FIG. 8, a duct adapter system 600 in accordance with an aspect of the disclosure is illustrated. Duct adapter system 600 comprises a duct adapter 601 fluidly coupled to an environmental conditioning unit 610 via a duct 608. Herein, a duct may refer to any material, apparatus, or structure that allows air to be moved from one location to another. Duct adapter 601, as shown in FIG. 8, may be configured to fit into a drive bay of a library frame, and thus may be configured, shaped, sized, and/or arranged similar to that of a data storage drive 15, as shown and described with respect to FIGS. 2, 3, and 7. For example, duct adapter 601 may have an enclosure or housing shaped, sized, and/or configured similar to a data storage drive 15. Alternatively, while duct adapter 601 may fit into a drive bay of the library frame, the outer appearance and/or form factor of the duct adapter may be different than that of a data storage drive 15. Still further, duct adapter 601 may contain one or more drive bricks to more efficiently utilize the space that duct adapter 601 occupies in a drive bay (e.g., the functionality of a data storage drive as well as the functionality of a duct adapter in a single drive bay).

As described above, a data storage drive 15 may extend through a drive bay such that a first end of the drive is in communication with the interior of the library frame, while a second end of the drive is in communication with a rear portion of the library frame. Similarly, duct adapter 601 may have a first end 602 which, when installed within a drive bay, is in communication with the interior of the library frame, and a second end 604 which may be in communication with a rear portion of the library frame. An extension 606 may protrude from the second end 604 so as to allow the duct adapter to be accessible from an external access point of the data storage library frame. As noted above with respect to FIG. 3, the rear panel or door 31 may have openings or access points therein to allow for selective access into the library frame 11. Thus, extension 606 may communicate with such an opening or access point to enable one or more ducts 608 to be fluidly connected to duct adapter 601. Alternatively, the extension 606 may be omitted and duct adapter 601 could be directly coupled to one or more ducts 608. The duct 608 may also be fluidly coupled to environmental conditioning unit 610 such that conditioned air provided by the environmental condition unit 610 is forced into the data storage library frame through the duct adapter 601, thereby conditioning the environment within the interior of the library frame. Preferably, the environmental conditioning unit 610 is not integrated with, and/or attached to the data storage library. In one embodiment the environmental conditioning unit is separate from the data storage library and not fixedly attached to the data storage library. In one aspect the environmental conditioning unit may be portable, and may in other aspects be on rollers for ready mobility.

In one aspect, duct adapter 601 may be utilized with duct 608 acting only as an air supply duct, with no return duct present for the recirculation of conditioned air within the data storage library frame. In such a scenario, positive air pressure will result within the library frame, thereby forcing conditioned air from the interior of the frame outward through any vents, openings, etc. that may be incorporated into the library frame and/or cracks that may be present. With such positive air pressure within the interior of the library frame, opening of the library door 17 (or rear door 31, or any other access opening of the library frame) would likely result in conditioned air being forced out of the opened library frame through the door opening, as opposed to ambient, external air intruding into the opened library frame. In this way, the environment within the data storage library frame may be protected from external conditions which may compromise or otherwise harm components within the data storage library. For example, the intrusion of warm, moist air from outside of the data storage library frame may result in the potentially damaging formation and/or accumulation of condensation on data storage cartridges, data storage drives, or other components of the data storage library. As such, having positive air pressure within the library frame may advantageously inhibit and/or prevent such intrusion of external ambient air. One or more fans typically utilized for data storage drives, power supplies, library controllers, etc. may help maintain air circulation within the data storage library frame. Due to the positive pressure configuration described above, such fan(s) may advantageously pull air from within the interior of the library frame, as opposed to from outside of the library frame, thereby maintaining positive pressure within the library frame.

In an alternative aspect, while not shown, duct adapter 601 may also be used to return air from the library frame to the environmental conditioning unit 610, thereby providing a recirculating (or closed-loop) environment within the data storage library. That is, the library frame may include multiple duct adapters, with at least one duct adapter configured for the supply of conditioned air from the environmental conditioning unit 610, and at least one duct adapter configured for the return of conditioned air to the environmental conditioning unit 610. Alternatively, one duct adapter may have both a supply duct (e.g., that provides conditioned air to the first end 602) and a return duct (e.g., that recycles air from the second end 604). Unlike the embodiment described above with respect to FIG. 8, a system having a duct adapter configured for return air may not provide for positive pressure within the data storage library frame. Accordingly, it may be advantageous to block any inlet and/or outlet vent holes formed on the library frame so as to prevent conditioned air from leaking from the library frame. The inlet and/or outlet holes may be blocked by, for example, cardboard, sheet metal, plastic, tape, or any other appropriate material capable of reducing or preventing the escape of air.

Furthermore, while not shown in FIG. 8, duct adapter 601 may also include one or more air handling valves therein. The one or more air handling valves may be utilized to help control the specific temperature and/or positive pressure within the library frame by, for example, controlling the flow of conditioned air between multiple duct adapters located in a single library frame. Additionally and/or alternatively, the air handling valves may be utilized to help control the temperature between multiple library frames, particularly in an instance where a single environmental conditioning unit is capable of suppling conditioned air to more than one duct adapter in more than one library frame.

Referring still to FIG. 8, duct adapter 601 may further include one or more environmental sensors 607 therein or thereon. The environmental sensor(s) 607 (e.g., temperature and/or humidity sensors) may be configured to determine one or more environmental conditions (e.g., temperature and/or humidity) within the duct adapter 601, within the library frame in which the duct adapter 601 is housed, and/or elsewhere along the duct air path of the environmental conditioning unit such that a control system is capable of maintaining a particular environment within the data storage library frame. The control system may be, for example, a library controller, such as library controller 400 described above with respect to FIG. 6. Alternatively, the control system may be a control system of environmental conditioning unit 610, a controller housed within duct adapter 601, or any other suitable control system. The sensor(s) 607 may communicate with the controller through a wired connection, a wireless connection, or combinations thereof. Also, while not shown in FIG. 8, it is to be understood that environmental sensors 607 may be located at various locations within the library frame, duct adapter(s), and/or ducts of the system 600.

Figure 9:
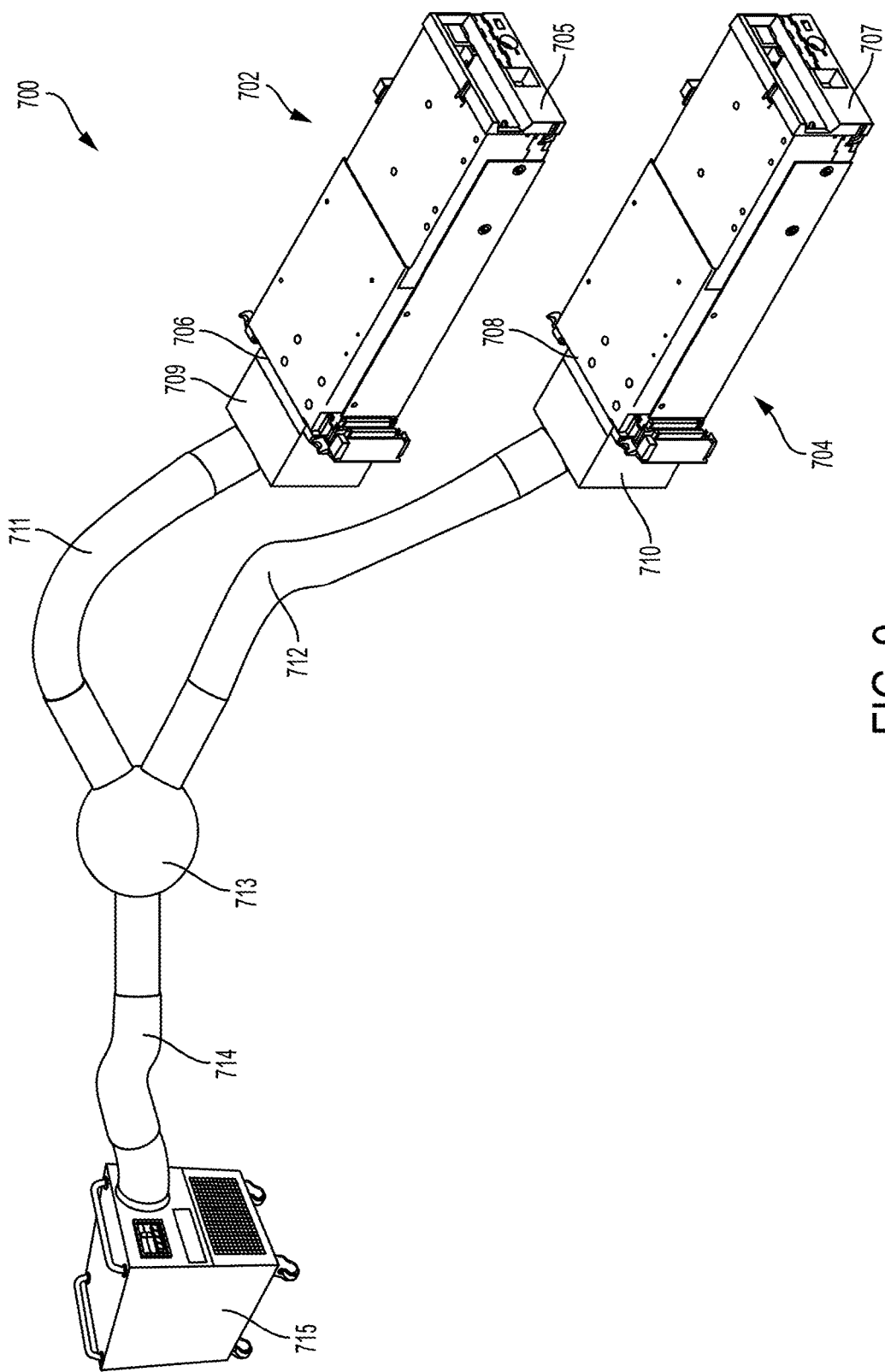
FIG. 9 is a perspective view of an environmental conditioning system for a data storage library in accordance with another aspect.

Next, referring to FIG. 9, a duct adapter system 700 in accordance with another aspect of the disclosure is illustrated. Duct adapter system 700 comprises a first duct adapter 702 and a second duct adapter 704, wherein each of duct adapters 702, 704 are fluidly connected to a single environmental conditioning unit 715. Specifically, first duct adapter 702 is connected to a first duct 711, while second duct adapter 704 is connected to a second duct 712. First duct 711 and second duct 712 are joined at a Y-duct 713, wherein Y-duct 713 is connected to a third duct 714, which is fluidly connected to the environmental conditioning unit 715. In one embodiment, environmental conditioning unit 715 is not integrated with, coupled to, and/or fixedly attached to the data storage library frames. In one aspect environmental conditioning unit is separate from the data storage library and may be portable. In a further aspect, environmental conditioning unit 715 may have rollers to facilitate its movement and portability.

Similar to duct adapter 601 described above, each of first duct adapter 702 and second duct adapter 704 may have respective first ends 705, 707 which, when installed within a drive bay of a data storage library frame, are in communication with the interior of the library frame(s), and respective second ends 706, 708 which may be in communication with a rear portion of the library frame(s). Respective extensions 709, 710 may protrude from the second ends 706, 708 so as to allow for the duct adapters to be accessible from an external access point of the data storage library frame(s). Thus, each of ducts 711, 712 may be fluidly coupled to environmental conditioning unit 715 such that conditioned air provided by the environmental condition unit 715 is directed into the data storage library frame(s) through the respective duct adapters 702, 704, thereby conditioning the environment within the interior of the library frame(s). Duct adapters 702 and/or 704 may contain one or more drive bricks to more efficiently utilize the space that duct adapters 702 and/or 704 occupy in a drive bay (e.g., the functionality of a data storage drive as well as the functionality of a duct adapter in a single drive bay).

While not shown in FIG. 9, it is to be understood that duct adapters 702, 704 may be housed within a single data storage library frame, or they may be housed in separate data storage library frames or in separate data storage libraries. That is, in one aspect, duct adapters 702, 704 may be retained within separate drive bays of the same data storage library frame so as to provide conditioned air to different areas within an interior of a data storage library frame. Alternatively, duct adapters 702, 704 may be retained within drive bays of different data storage library frames so as to provide conditioned air from a single environmental conditioning unit 715 into two separate data storage library frames. Still further, duct adapters 702, 704 may be retained within drive bays of different data storage libraries so as to provide conditioned air from a single environmental conditioning unit 715 into two separate data storage libraries. Furthermore, as discussed above, duct adapters 702, 704 may also include one or more air handling valves therein. The one or more air handling valves may be utilized to help control the specific environment (e.g., temperature and/or positive pressure within the library frame(s) by, for example, controlling the flow of conditioned air between duct adapters 702, 704 located in a single library frame. Additionally and/or alternatively, the air handling valves may be utilized to help control the environment (e.g., temperature) between multiple library frames, particularly in an instance where a single environmental conditioning unit 715 is capable of suppling conditioned air to duct adapters 702, 704 located in separate data storage library frames (which may or may not be located in different data storage libraries). In one embodiment, the air handling valve(s) may be located in Y-duct 713. Also, while not shown, it is to be understood that duct adapters 702, 704 may contain, either therein or thereon, one or more environmental sensors so as determine environmental conditions within the duct adapters 702, 704, within the library frame(s) in which the duct adapters 702, 704 are housed, and/or elsewhere within the system 700.

Referring still to FIG. 9, it is to be noted that duct adapter system 700 is configured without a return duct and/or return air path. Accordingly, each of ducts 711, 712, 714 operate as supply ducts for providing conditioned air into one or more library frames, without a return duct for recirculation of conditioned air back to the environmental conditioning unit 715. In this way, duct adapter system 700 may provide for a positive pressure environment within the data storage library frame, as detailed above. While not illustrated in FIG. 9, duct adapter system 700 may include one or more return ducts.

Figure 10:
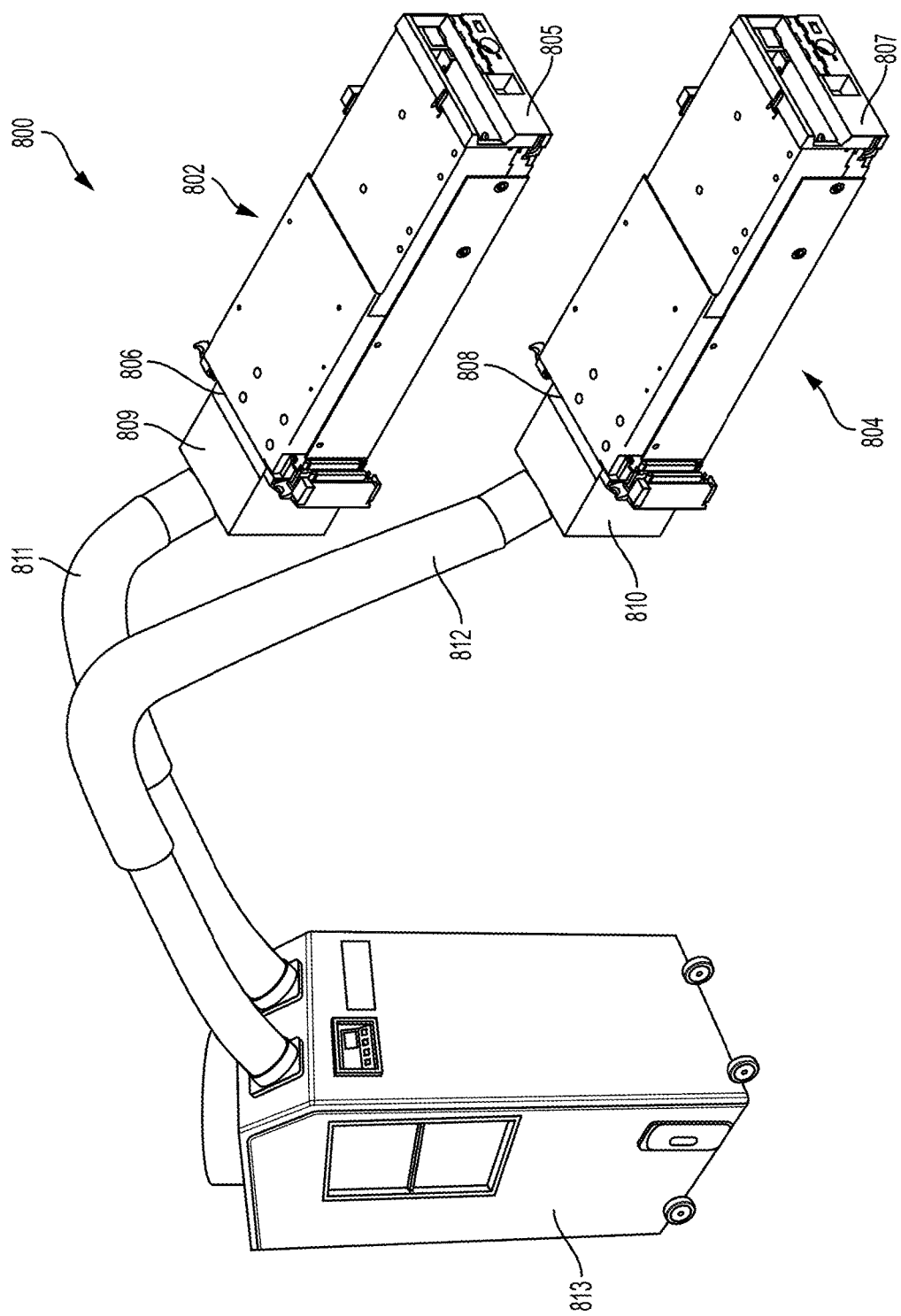
FIG. 10 is a perspective view of an environmental conditioning system for a data storage library in accordance with another aspect.

Next, referring to FIG. 10, a duct adapter system 800 in accordance with another aspect of the disclosure is illustrated. Duct adapter system 800 includes a first duct adapter 802 and a second duct adapter 804, wherein each of duct adapters 802, 804 is fluidly connected to a single environmental conditioning unit 813. However, unlike duct adapter system 700 described above, duct adapters 802, 804 are each independently connected to environmental conditioning unit 813. Duct adapters 802, 804 may form a recirculating (i.e., closed-loop) system. Specifically, first duct adapter 802 is connected to a first duct 811, while second duct adapter 804 is connected to a second duct 812. Each of ducts 811 and 812 are also fluidly connected to the environmental conditioning unit 813.

Similar to duct adapters 601, 702, and 704 described above, each of first duct adapter 802 and second duct adapter 804 may have respective first ends 805, 807 which, when installed within a drive bay of a data storage library frame, are in communication with the interior of the library frame(s), and respective second ends 806, 808 which may be in communication with a rear portion of the library frame(s). Respective extensions 809, 810 may protrude from the second ends 806, 808 so as to allow for the duct adapters to be accessible from an external access point of the data storage library frame(s). Thus, each of ducts 811, 812 may be fluidly connected to environmental conditioning unit 813. Conditioned air may be provided by the environmental conditioning unit 813 to first duct adapter 802 via duct 811 such that the interior of a data storage library frame receives the conditioned air. Conditioned air from within the interior of the data storage library frame may enter second duct adapter 804 and recirculate back to the environmental conditioning unit 813 via the second duct 812. As noted above, such a configuration may form a closed-loop system within the data storage library frame, and thus the data storage library frame may not be subject to positive pressure therein. Duct adapters 802 and/or 804 may contain one or more drive bricks to more efficiently utilize the space that duct adapters 802 and/or 804 occupy in a drive bay (e.g., the functionality of a data storage drive as well as the functionality of a duct adapter in a single drive bay).

Furthermore, while not shown, it is to be understood that duct adapters 802, 804 may contain, either therein or thereon, one or more environmental sensors so as determine environmental conditions within the duct adapters 802, 804, within the library frame(s) in which the duct adapters 802, 804 are housed, and/or elsewhere within the system 800. Preferably, the environmental conditioning unit is not integrated with, and/or attached to the data storage library. In one embodiment, the environmental conditioning unit is separate from the data storage library and not fixedly attached to the data storage library. In one aspect, the environmental conditioning unit may be portable, and may in other aspects be on rollers for ready mobility.

Figure 11:
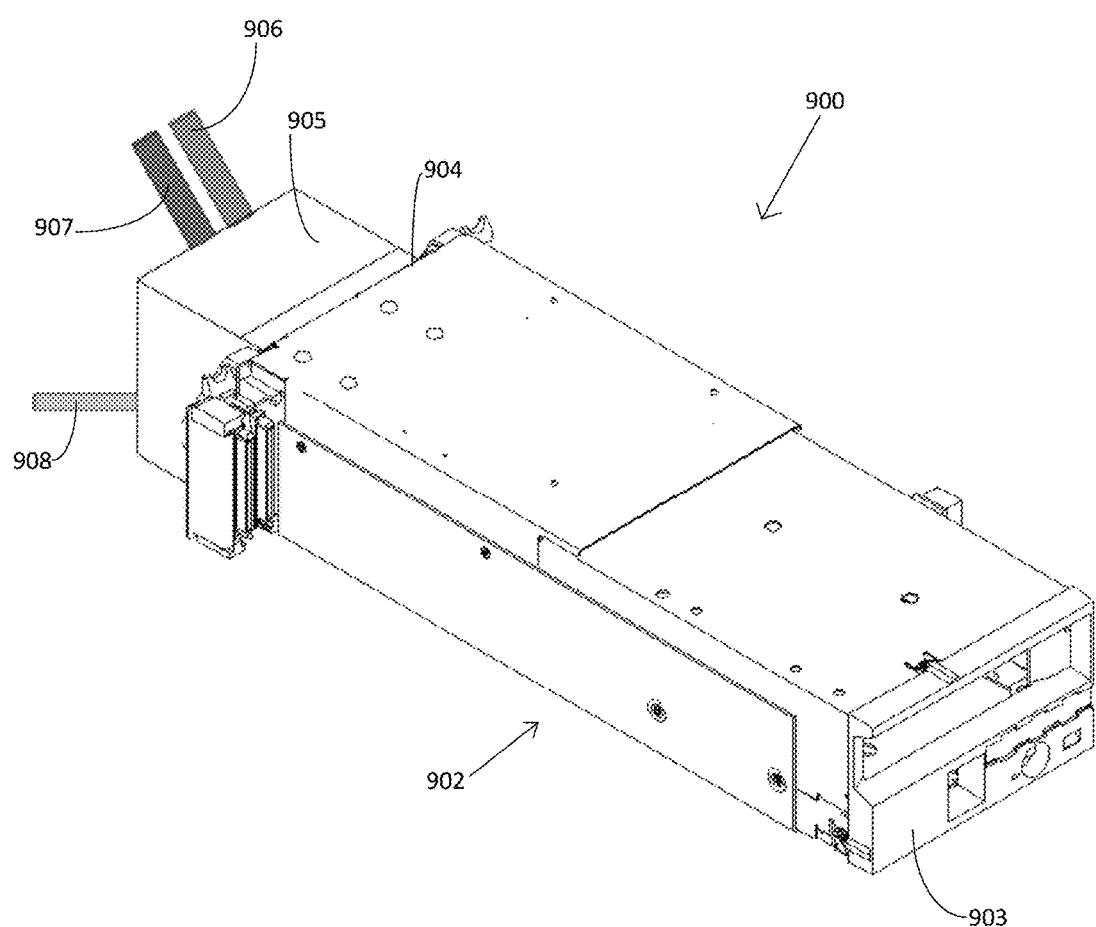
FIG. 11 is a perspective view of an environmental conditioning system for a data storage library in accordance with another aspect.

Referring now to FIG. 11, an environmental device adapter system 900 in accordance with another aspect of the disclosure is illustrated. Adapter system 900 comprises an environmental device adapter 902, wherein environmental device adapter 902 may be configured to fit into a drive bay of a library frame, and thus may have a size, shape, and/or configuration similar to that of a data storage drive 15, as shown and described with respect to FIGS. 2, 3, and 7. For example, environmental device adapter 902 may have an enclosure or housing shaped, sized and/or configured similar to a data storage drive utilized in the data storage library. Alternatively, while environmental device adapter 902 may fit into a drive bay of the library frame, the outer appearance, shape, and/or configuration of the environmental device adapter may be different than that of a data storage drive 15.

Environmental device adapter 902 may have a first end 903 which, when installed within a drive bay, is in communication with the interior of the library frame, and a second end 904 which may be in communication with a rear portion of the library frame. However, unlike the embodiments described above with respect to FIGS. 8-10, environmental device adapter 902 is not configured to be fluidly connected to a forced-air type environmental conditioning unit. Rather, environmental device adapter 902 may include a partially-integrated environmental conditioning device 905, which may protrude from the second end 904 so as to allow for the environmental device adapter 902 to be accessible from an external access point of the data storage library frame. Within the partially-integrated environmental conditioning device 905 may be a condenser coil (not shown) and one or more fans (not shown) to move air over the condenser coil. Respective refrigerant lines 906, 907 may be fluidly connected to the partially-integrated environmental conditioning device 905 so as to provide a path for refrigerant to enter the condenser coil and return back to an external environmental conditioning unit (not shown, e.g., a heat exchanger and compressor). A condensate line 908 may provide a drain for any condensation that may accumulate on the condenser coil within the partially-integrated environmental conditioning device 905. Additionally and/or alternatively, environmental device adapter 902 may include one or more cooling fins disposed therein in order to aid in the cooling of air passing through environmental device adapter 902. Thus, while the environmental conditioning units as described above with respect to FIGS. 8-10 pertain to a device that is external to both the data storage library and the duct adapters, the environmental conditioning device(s) described herein (and/or components thereof) may be at least partially integrated with the data storage library and/or the environmental device adapter(s).

As noted above, partially-integrated environmental conditioning device 905 may comprise one or more fans in order to move air over the condenser coil and/or cooling fins to cool and/or remove moisture from the air. Alternatively, the condenser coil may warm the air (for example, as a heat pump), and may be used to add moisture to the air. The direction of air flow from the one or more fans through environmental device adapter 902 may be configured in various ways in order to move air in a direction best suited for the particular library frame. For example, if the data storage library frame comprises ventilation fans which normally move air from the exterior of the library frame to the interior of the library frame, then the one or more fans within the partially-integrated environmental conditioning device 905 may be configured to move air from the interior of the library to the exterior of the library in order to provide efficient circulation of warm and cool air. Environmental device adapter 902 may contain one or more drive bricks to more efficiently utilize the space that environmental device adapter 902 occupies in a drive bay (e.g., the functionality of a data storage drive as well as the functionality of an environmental device adapter in a single drive bay).

Alternatively, a data storage library frame may incorporate multiple environmental device adapters 902, wherein one or more adapters may be configured to move air in a first direction, while one or more separate adapters may be configured to move air in a second, opposite direction, thereby providing air circulation within the data storage library frame.

Furthermore, in some cases, it may be advantageous to block any inlet and/or outlet vent holes formed on the library frame so as to prevent conditioned air from leaking from the library frame. The inlet and/or outlet holes may be blocked by, for example, cardboard, sheet metal, plastic, tape, or any other appropriate material capable of preventing the escape of air.

Additionally and/or alternatively, when the environmental device adapter is housed within a drive bay of the library frame, the one or more fans within environmental device adapter 902 may be powered via the power connector normally utilized to provide power to a conventional data storage drive, such as data storage drive 15. Additionally, or alternatively, the one or more fans within environmental device adapter 902 may receive some or all of their power from an external power cable attached to the environmental device adapter 902. The partially-integrated environmental conditioning device 905 may also receive power via the power connector normally utilized to provide power to a conventional data storage drive utilized in the data storage library.

Referring still to FIG. 11, as discussed above, high humidity within a data storage library frame may be undesirable due to the possibility of the formation and/or accumulation of condensation on sensitive components within the data storage library, such as data storage drives, data storage cartridges, etc. However, very low humidity may also cause issues within the data storage library, as overly dry air may cause static electricity to build up within the library frame. Thus, in accordance with another aspect, environmental device adapter 902 may further include a humidifier (not shown) configured to add moisture back into the air after air has passed over the condenser coil within partially-integrated environmental conditioning device 905. A water supply line (not shown) may be provided to environmental device adapter 902 to supply the humidifier, and/or condensate collected by condensate line 908 could be recycled back to the humidifier, thereby re-adding moisture that was removed during the cooling process.

Furthermore, while not shown, it is to be understood that environmental device adapter 902 may contain, either therein or thereon, one or more environmental sensors so as determine environmental conditions within the environmental device adapter 902, within the library frame(s) in which the environmental device adapter 902 is housed, and/or elsewhere within the system 900.

Figure 12:
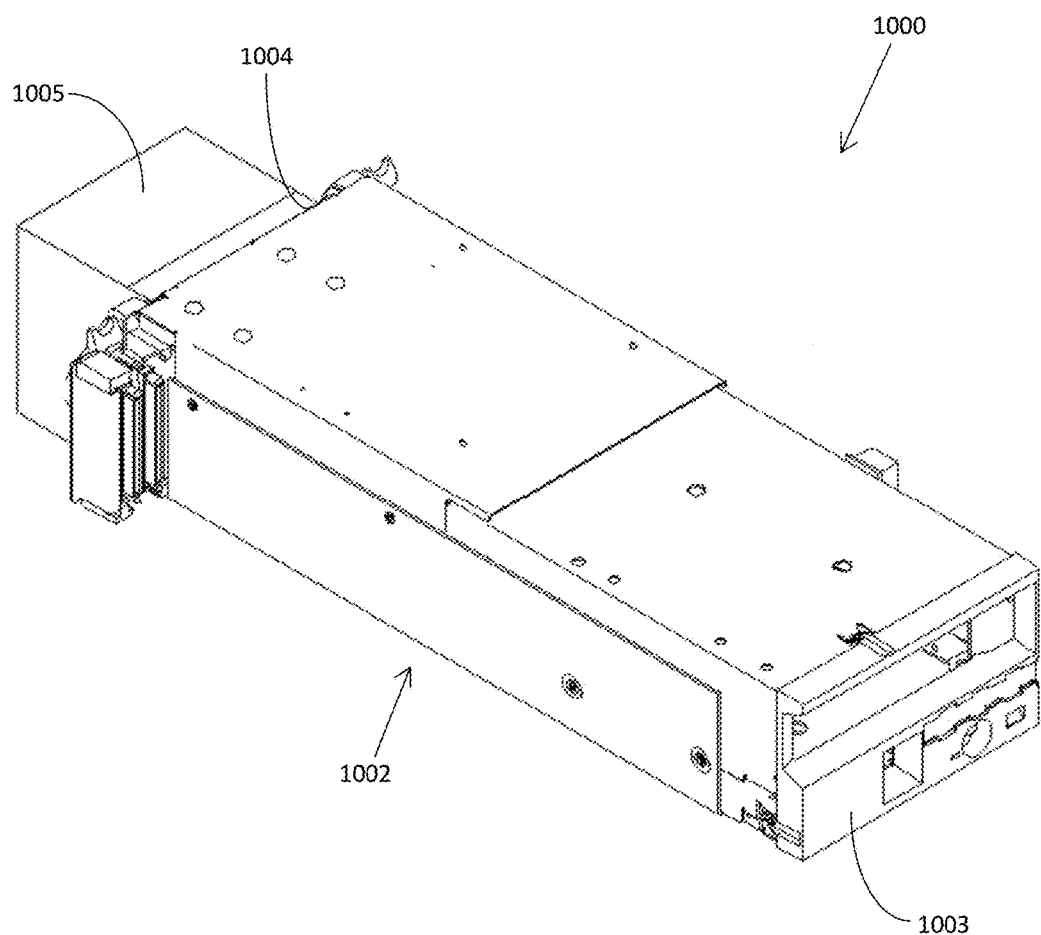
FIG. 12 is a perspective view of an environmental conditioning system for the data storage library in accordance with another aspect.

Next, referring to FIG. 12, an environmental device adapter system 1000 in accordance with another aspect of the disclosure is illustrated. Environmental device adapter system 1000 comprises an environmental device adapter 1002, wherein environmental device adapter 1002 may be configured to fit into a drive bay of a library frame, and thus may have a size, shape, and/or configuration similar to that of a data storage drive 15, as shown and described with respect to FIGS. 2, 3, and 7. For example, environmental device adapter 1002 may have an enclosure or housing shaped, sized, and/or configured similar to a data storage drive utilized in the data storage library. Alternatively, while environmental device adapter 1002 may fit into a drive bay of the library frame, the outer appearance and/or form factor of the environmental device adapter may be different than that of a data storage drive 15. Environmental device adapter 1002 may contain one or more drive bricks to more efficiently utilize the space that environmental device adapter 1002 occupies in a drive bay (e.g., the functionality of a data storage drive as well as the functionality of an environmental device adapter in a single drive bay).

Environmental device adapter 1002 may have a first end 1003 which, when installed within a drive bay, is in communication with the interior of the library frame, and a second end 1004 which may be in communication with a rear portion of the library frame. However, unlike the embodiments described above with respect to FIGS. 8-10, environmental device adapter 1002 is not configured to be fluidly connected to a forced-air type environmental conditioning unit. Furthermore, unlike the embodiment described above with respect to FIG. 11, environmental device adapter 1002 is also not coupled to external refrigerant lines. Rather, environmental device adapter 1002 may include an integrated environmental conditioning device 1005, which, in some instances, may protrude from the second end 1004 so as to allow for the environmental device adapter 1002 to be accessible from an external access point of the data storage library frame. Within the integrated environmental conditioning device 1005 may be one or more thermoelectric heaters, one or more thermoelectric coolers, one or more ionizers, one or more deionizers, one or more electric heaters, one or more humidifiers, one or more dehumidifiers, one or more filters, or any other device that conditions air, or combinations thereof.

The environmental device adapter 1002 and/or integrated environmental conditioning device 1005 may comprise one or more fans in order to move air over the conditioning elements (e.g., cooling or heating fins) within the environmental conditioning device 1005 (e.g., a thermocouple, ionizer, deionizer, heater, humidifier, dehumidifier, filter, etc.). The direction of air flow from the one or more fans through environmental device adapter 1002 may be configured in various ways in order to move air in a direction best suited for the particular library frame. For example, if the data storage library frame comprises ventilation fans which normally move air from the exterior of the library frame to the interior of the library frame, then the one or more fans within the environmental device adapter 1002 and/or integrated environmental conditioning device 1005 may be configured to move air from the interior of the library to the exterior of the library in order to provide efficient circulation of warm and cool air.

Alternatively, a data storage library frame may incorporate multiple environmental device adapters 1002, wherein one or more environmental device adapters may be configured to move air in a first direction, while one or more separate environmental device adapters may be configured to move air in a second direction (e.g., opposite direction), thereby providing air circulation within the data storage library frame.

Furthermore, in some cases, it may be advantageous to block any inlet and/or outlet vent holes or openings formed on the library frame so as to prevent conditioned air from leaking from the library frame. The inlet and/or outlet holes may be blocked by, for example, cardboard, sheet metal, plastic, tape, or any other appropriate material capable of preventing the escape of air.

Additionally and/or alternatively, when the environmental device adapter is housed within a drive bay of the library frame, the one or more electrical devices within environmental conditioning device 1005 and/or the one or more fans within environmental device adapter 1002 may be powered via the power connector normally utilized to provide power to a conventional data storage drive, such as data storage drive 15. Additionally, or alternatively, the one or more electrical devices within environmental conditioning device 1005 and/or the one or more fans within environmental device adapter 1002 may receive some or all of their power from an external power cable attached to the environmental device adapter 1002.

Also, as discussed above, high humidity within a data storage library frame may be undesirable due to the possibility of the formation and/or accumulation of condensation on sensitive components within the data storage library, such as data storage drives, data storage cartridges, etc., and very low humidity may also cause issues within the data storage library, as overly dry air may cause static electricity to build up within the library frame. Thus, in accordance with another aspect, environmental device adapter 1002 may further include a humidifier (not shown) configured to add moisture back into the air after air has passed through integrated environmental conditioning device 1005. A water supply line (not shown) may be provided to environmental device adapter 1002 to supply the humidifier, and/or a condensate line (not shown) may also be provided and may be configured to recycle condensate back to the humidifier, thereby re-adding moisture that was removed during the cooling process. Additionally, or alternatively, the environmental device adapter 1002 may further include a dehumidifier to remove moisture from the air within the interior of the data storage library.

Furthermore, while not shown, it is to be understood that environmental device adapter 1002 may contain, either therein or thereon, one or more environmental sensors (e.g., temperature and/or humidifier sensors) so as determine environmental conditions within the environmental device adapter 1002, within the library frame(s) in which the environmental device adapter 1002 is housed, and/or elsewhere within the system 1000.

While aspects of the disclosure described above with respect to FIGS. 8-12 each describe a duct adapter or environmental device adapter configured to fit into a drive bay of a library frame, it is to be understood that one or more duct adapters and/or environmental device adapters may be configured to fit into any other location within the library frame. The one or more duct adapters and/or environmental device adapters may fit within any location that is equipped to house components of the library, and/or within any other components. For example, one or more duct adapters and/or environmental device adapters may alternatively be fabricated to fit into a power supply bay, a library controller bay, an optional component bay, or any other suitable location within the data storage library frame.

Additionally, it is to be understood that any of the aspects described above with respect to FIGS. 8-12 may be utilized singularly or may be combined. For example, a duct adapter in accordance with the disclosure may have an air supply line, as shown and described with respect to FIG. 8, along with a thermoelectric heater, as shown and described with respect to FIG. 12.

Furthermore, it is to be understood that "environmental conditioning unit" and "environmental conditioning device" as referred to above may constitute any device(s) which conditions air, including heating, cooling, ionizing, deionizing, humidifying, dehumidifying, and/or any other modification to the ambient air. Example systems may include refrigerated cooling, heating (e.g., heat pump), evaporative cooling, humidifier, dehumidifier, ionizer, deionizer, thermoelectric coolers, thermoelectric heaters, etc. In some ambient environments (for example, in hot and humid environments), an environmental conditioning unit configured to cool and remove moisture from the air may be utilized. However, other ambient environments (for example, in cold and dry environments), an environmental conditioning unit may be configured to warm and/or add moisture to the air.

Figure 13:
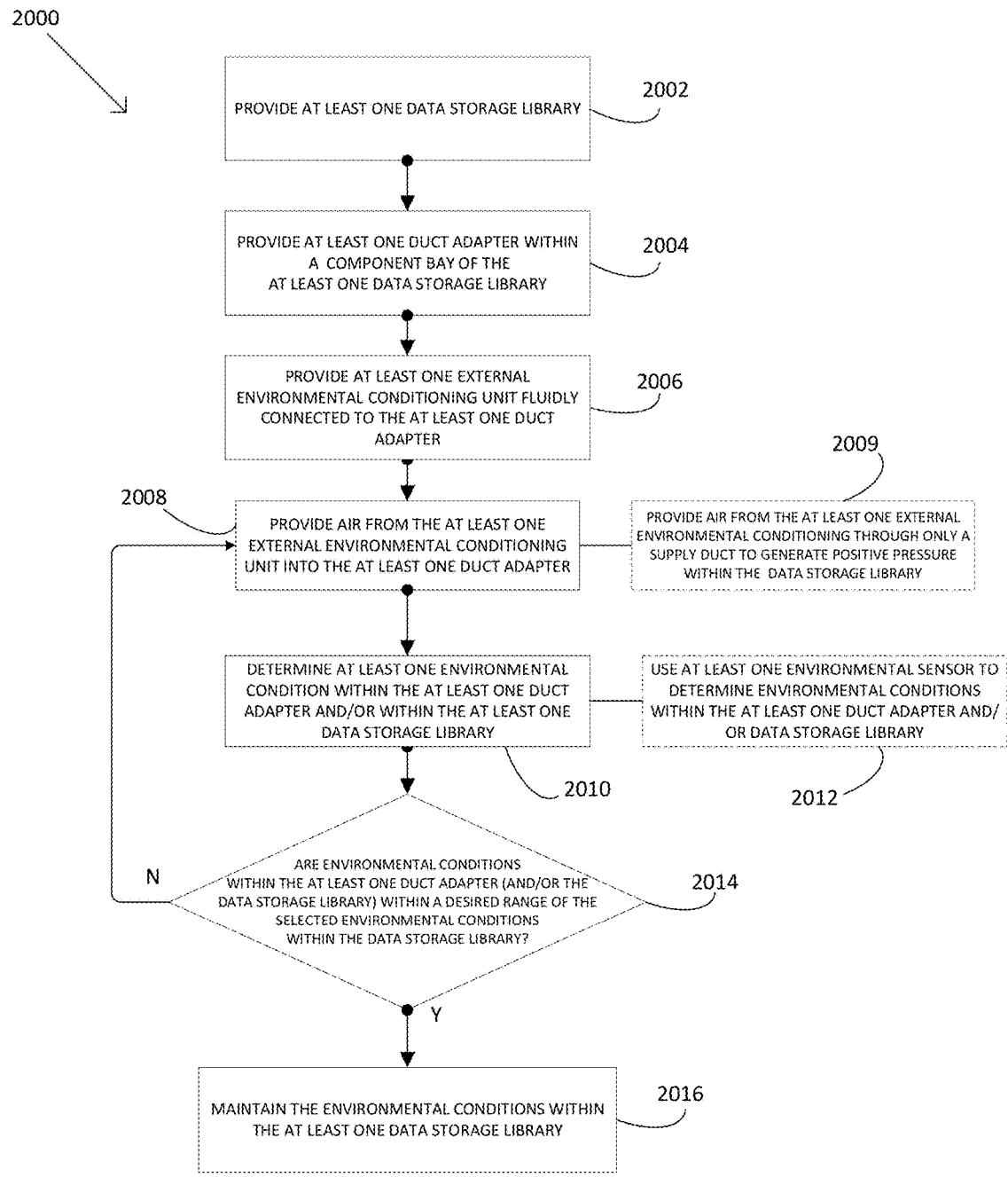
FIG. 13 is a flowchart of a method of providing environmentally controlled air into a data storage library in accordance with one aspect.

Next, referring to FIG. 13, a process 2000 for providing environmentally conditioned air into a data storage library according to one embodiment is disclosed. While process 2000 may be considered for the sake of convenience and not with the intent of limiting the disclosure as comprising a series and/or number of steps, it is to be understood that the process may be integrated and one or more steps may be performed together, the process does not need to be performed as a series of steps and/or the steps do not need to be performed in the order shown and described with respect to FIG. 13. At 2002, at least one data storage library is provided. At 2004, at least one duct adapter is provided within at least one component bay of the data storage library(s). As detailed above, the at least one component bay may be at least one of a drive bay, a power supply bay, a library controller bay, and an optional component bay. Alternatively and/or additionally, the at least one component bay may be any appropriate opening and/or location within the interior of the data storage library.

At 2006, at least one external environmental conditioning unit may be fluidly connected to the at least one duct adapter via, for example, one or more ducts. At 2008, air from the at least one external environmental conditioning unit is provided into the at least one duct adapter such that the air is able to be transferred to and/or condition the environment within the interior of the data storage library. In some aspects, at 2009, air from the at least one external environmental conditioning unit may only be provided via a supply duct (with no return duct) such that positive pressure may be generated within the data storage library. At 2010, at least one environmental condition (e.g., temperature and/or humidity) within the at least one duct adapter and/or within the data storage library is determined. Such a determination may be made, for example, by using at least one environmental sensor (e.g., temperature and/or humidity sensors) at 2012.

At 2014, it is determined whether the environmental conditions within at least one duct adapter and/or within the data storage library are within a desired range of the selected environmental conditions (e.g., temperature, humidity, etc.) within the data storage library. The selected environmental conditions within the at least one duct adapter and/or within the data storage library may be predetermined based on known desirable operational conditions, or may be calculated based on exterior conditions, operational status of the data storage library, etc. If the environmental conditions are not within the desired range of selected environmental conditions within the data storage library, conditioned air from the at least one external environmental conditioning unit may continue to be provided into the data storage library by way of the at least one duct adapter. However, if yes, the selected environmental conditions within the data storage library are within a desired range, then the environmental conditions within the data storage library may be maintained at 2016. Such maintenance of the environmental conditions within the data storage library may include shutting down the external environmental conditioning unit (e.g., turning off or reducing power to, fans, compressors, pumps, etc.) when the selected environmental conditions are reached, and/or selectively and intermittently operating the external environmental conditioning unit so as to maintain the selected environmental conditions. Steps 2010, 2012, and/or 2014 may be omitted. For example, the environmental conditioning unit may run continuously, may run on a timer, may run based on environmental conditions outside the library or the duct adapter (e.g., based on ambient environmental conditions in the datacenter), etc.

Figure 14:
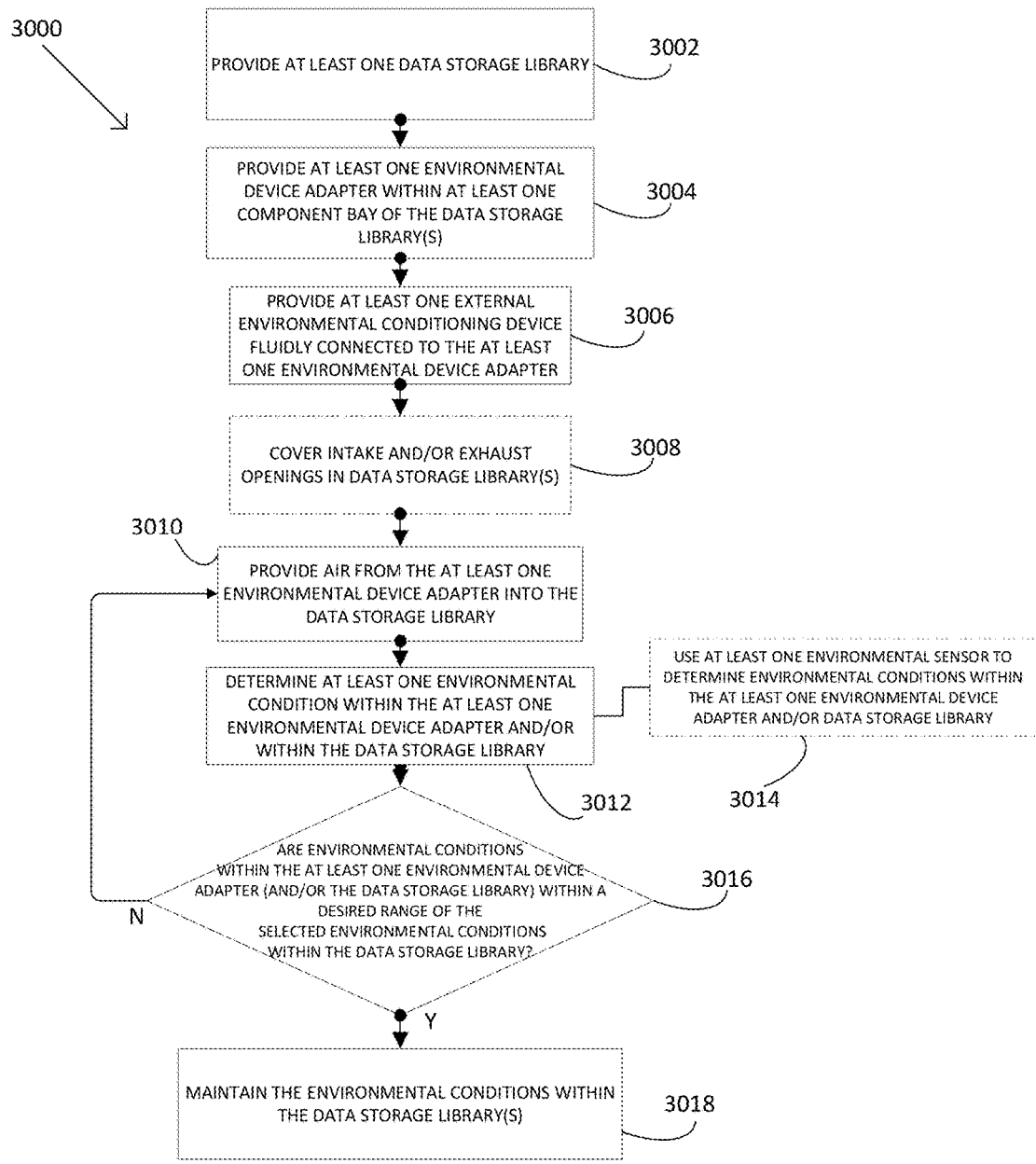
FIG. 14 is a flowchart of a method of providing environmentally controlled air into a data storage library in accordance with another aspect.

Referring now to FIG. 14, a process 3000 for providing environmentally conditioned air into a data storage library according to another embodiment is disclosed. While process 3000 may be considered for the sake of convenience and not with the intent of limiting the disclosure as comprising a series and/or number of steps, it is to be understood that the process may be integrated and one or more steps may be performed together, the process does not need to be performed as a series of steps and/or the steps do not need to be performed in the order shown and described with respect to FIG. 14. At 3002, at least one data storage library is provided. At 3004, at least one environmental device adapter is provided within at least one component bay of the data storage library(s). As detailed above, the at least one component bay may at least one of a drive bay, a power supply bay, a library controller bay, and an optional component bay. Alternatively and/or additionally, the at least one component bay may be any appropriate opening within the interior of the data storage library.

At 3006, at least one external environmental conditioning device is provided and fluidly connected to the at least one environmental device adapter. As set forth above, the at least one external environmental conditioning device may be connected to the at least one environmental device adapter via, for example, one or more refrigerant lines. At least a portion of the external environmental conditioning device may be external to the data storage library (e.g., a compressor, heat exchanger, etc.), while another portion of the environmental conditioning device may be coupled to or integrated with the environmental device adapter (e.g., condenser coils, etc.). The environmental conditioning device and/or the environmental conditioning adapter optionally may be powered by one or more connectors utilized in the data storage library, and which are typically used to power components within the data storage library. At 3008, any intake and/or exhaust openings in the data storage library optionally may be covered (i.e., physically blocked).

At 3010, conditioned air from the at least one environmental device adapter is provided into the data storage library(s). At 3012, at least one environmental condition (e.g., temperature and/or humidity) within the at least one environmental device adapter and/or within the data storage library is determined. Such a determination may be made, for example, by using at least one environmental sensor (e.g., temperature and/or humidity sensors) within the environmental device adapter(s) and/or the data storage library(s) at 3014.

At 3016, it is determined whether the environmental conditions within the at least one environmental device adapter and/or within the data storage library are within a desired range of the selected environmental conditions (e.g., temperature, humidity, etc.) within the data storage library. The selected environmental conditions within the data storage library may be predetermined based on known desirable operational conditions, or may be calculated based on exterior conditions, operational status of the data storage library, etc. If the environmental conditions are not within the desired range of selected environmental conditions within the data storage library, conditioned air from the at least one environmental device adapter may continue to be provided into the data storage library(s). However, if yes, the selected environmental conditions are within a desired range, then the environmental conditions within the data storage library(s) may be maintained at 3018. Such maintenance of the environmental conditions within the data storage library(s) may include shutting down the external environmental conditioning device (e.g., turning off or reducing power to, fans, compressors, pumps, etc.) when the desired environmental conditions are reached, and/or selectively and intermittently operating the external environmental conditioning device so as to maintain the desired environmental conditions. Steps 3012, 3014, and/or 3016 may be omitted. For example, the external environmental conditioning device may run continuously, may run on a timer, may run based on environmental conditions outside the library or the environmental device adapter (e.g., based on ambient environmental conditions in the datacenter), etc.

Figure 15:
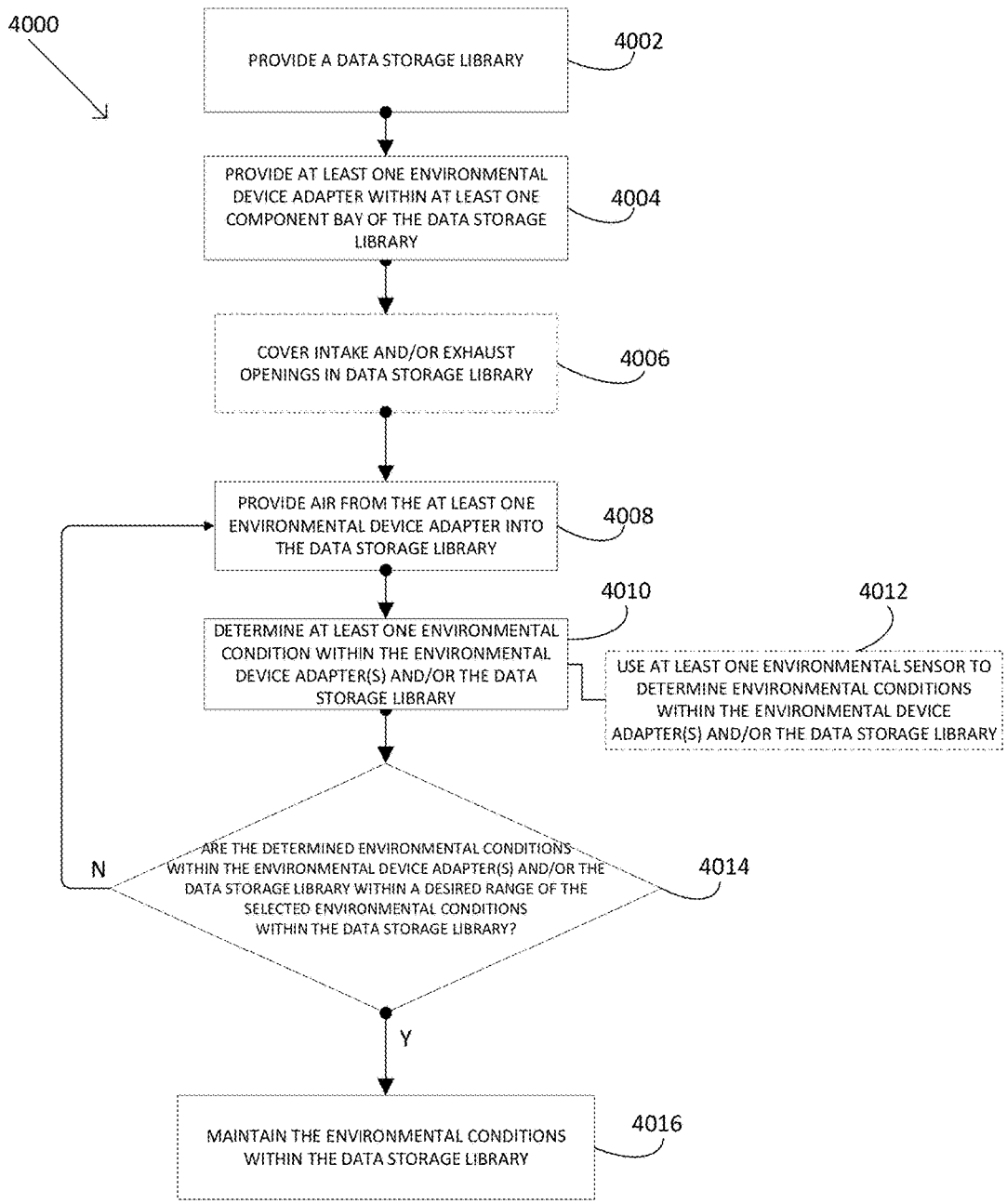
FIG. 15 a flowchart of a method of providing environmentally controlled air into a data storage library in accordance with another aspect.

Referring now to FIG. 15, a process 4000 for providing environmentally conditioned air into a data storage library according to another embodiment is disclosed. While process 4000 may be considered for the sake of convenience and not with the intent of limiting the disclosure as comprising a series and/or number of steps, it is to be understood that the process may be integrated and one or more steps may be performed together, the process does not need to be performed as a series of steps and/or the steps do not need to be performed in the order shown and described with respect to FIG. 15. At 4002, at least one data storage library is provided. At 4004, at least one environmental device adapter is provided within at least one component bay of the data storage library(s). As detailed above, the at least one component bay may be at least one of a drive bay, a power supply bay, a library controller bay, and an optional component bay. Alternatively and/or additionally, the at least one component bay may be any appropriate opening and/or location within the interior of the data storage library.

At 4006, any intake and/or exhaust openings in the data storage library optionally may be covered (i.e., physically blocked). At 4008, conditioned air from the at least one environmental device adapter is provided into the data storage library(s). The at least one environmental device adapter may include, for example, a filter, a thermoelectric cooler and/or a thermoelectric heater, as well as one or more fans configured for the movement of air into or out of the environmental device adapter(s).

At 4010, at least one environmental condition (e.g., temperature and/or humidity) within the at least one environmental device adapter and/or within the data storage library is determined. Such a determination may be made, for example, by using at least one environmental sensor (e.g., temperature and/or humidity sensors) within the environmental device adapter(s) and/or the data storage library(s) at 4012.

At 4014, it is determined whether the environmental conditions within the at least one environmental device adapter and/or within the data storage library are within a desired range of the selected environmental conditions (e.g., temperature, humidity, etc.) within the data storage library. The selected environmental conditions within the data storage library may be predetermined based on known desirable operational conditions, or may be calculated based on exterior conditions, operational status of the data storage library, etc. If the environmental conditions are not within the desired range of selected environmental conditions within the data storage library, conditioned air from the at least one environmental device adapter may continue to be provided into the data storage library(s). However, if yes, the selected environmental conditions within the data storage library are within a desired range, then the environmental conditions within the data storage library(s) may be maintained at 4016. Such maintenance of the environmental conditions within the data storage library(s) may include shutting down the environmental device adapter(s) (e.g., turning off or reducing power to, fans, compressors, pumps, etc.) when the desired environmental conditions are reached, and/or selectively and intermittently operating the environmental device adapter(s) so as to maintain the desired environmental conditions. Steps 4010, 4012, and/or 4014 may be omitted. For example, the environmental device adapter may run continuously, may run on a timer, may run based on environmental conditions outside the library or the environmental device adapter (e.g., based on ambient environmental conditions in the datacenter), etc.

It follows that various embodiments described and/or suggested herein are able to provide data storage systems, and optionally, automated data storage libraries having environmental control capabilities associated with the automated data storage library, with at least one duct adapter or environmental device adapter. As a result, favorable conditions (e.g., temperature, humidity, absence of contaminants, etc.) may be maintained for the data storage drives, data storage cartridges, data storage media, and other library components within the data storage library. Furthermore, the one or more duct adapters and/or environmental device adapters may be temporary, semi-permanent, or permanent structures, depending upon the application and user needs. As such, the adapter(s) and/or external environmental conditioning unit(s) may be utilized on various makes, models, and sizes of data storage libraries.

The present disclosure may be a system, a method, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. By integrated with, what is meant is that the processor has logic embedded therewith as hardware logic, such as an application specific integrated circuit (ASIC), a field programmable gate array (FPGA), etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), a graphics processing unit (GPU), etc.

A data processing system suitable for storing and/or executing program code may include at least one processor, which may be or be part of a controller, coupled directly or indirectly to memory elements through a system bus, such as controller 400 of FIG. 6. The memory elements can include local memory employed during actual execution of the program code, such as nonvolatile memory 404 of FIG. 6, bulk storage, and cache memories which provide temporary storage of at least some program code in order to reduce the number of times code must be retrieved from bulk storage during execution.

It will be clear that the various features of the foregoing systems and/or methodologies may be combined in any way, creating a plurality of combinations from the descriptions presented above.

It will be further appreciated that embodiments of the present disclosure may be provided in the form of a service deployed on behalf of a customer to offer service on demand.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system comprising:
a data storage library, wherein the data storage library comprises at least one component bay therein;
at least one duct adapter configured to fit within the at least one component bay; and
at least one environmental conditioning unit fluidly connected to the at least one duct adapter via at least one duct, wherein the at least one environmental conditioning unit is configured to control at least one environmental condition within the data storage library,
wherein the at least one duct adapter further comprises at least one environmental sensor configured to sense at least one environmental condition in at least one of in, on, or near the at least one duct adapter and in, on, or near the data storage library.

2. The system of claim 1, wherein the at least one component bay is at least one of a drive bay, a power supply bay, a library controller bay, and an optional component bay.

3. The system of claim 1, wherein the at least one duct comprises a supply duct configured to supply air from the at least one environmental conditioning unit.

4. The system of claim 3, further comprising a Y-duct, wherein the Y-duct is configured to provide air from the supply duct to a first duct adapter and a second duct adapter.

5. The system of claim 1, wherein the at least one duct comprises a supply duct configured to supply air from the at least one environmental conditioning unit and a return duct configured to recirculate conditioned air to the at least one environmental conditioning unit.

6. The system of claim 5, wherein the supply duct is fluidly connected to a first duct adapter and the return duct is fluidly connected to at least one of the first duct adapter and a second duct adapter.

7. The system of claim 1, wherein the at least one environmental conditioning unit comprises at least one device configured to perform at least one of filtering, refrigerated cooling, heating, evaporative cooling, humidifying, dehumidifying, ionizing, deionizing, thermoelectric cooling, and thermoelectric heating.

8. A system comprising:
at least one data storage library, wherein the at least one data storage library comprises at least one component bay therein;
at least a first duct adapter and a second duct adapter, wherein each of the first duct adapter and the second duct adapter is configured to fit within a respective component bay;
at least one environmental conditioning device connected to the first duct adapter and the second duct adapter via at least one duct, wherein the at least one environmental conditioning device is configured to control at least one environmental condition within the at least one data storage library, and further wherein the at least one duct comprises a supply duct configured to supply air from the at least one environmental conditioning device; and
a Y-duct, wherein the Y-duct is configured to provide air from the supply duct to the first duct adapter and the second duct adapter.

9. The system of claim 8, wherein the at least one of the first duct adapter and the second duct adapter comprises at least one environmental device adapter fluidly connected to at least one external environmental conditioning device.

10. The system of claim 9, wherein the at least one environmental device adapter comprises a condenser coil.

11. The system of claim 10, wherein the condenser coil is fluidly connected to the at least one external environmental conditioning device via at least one refrigerant line.

12. The system of claim 8, wherein the at least one environmental conditioning device comprises at least one integrated environmental conditioning device coupled to the at least one of the first duct adapter and the second duct adapter, the at least one integrated environmental conditioning device comprising at least one of a filter, a thermoelectric heater, a thermoelectric cooler, an ionizer, a deionizer, an electric heater, a humidifier, and a dehumidifier.

13. A method of controlling at least one environmental condition within a data storage library, the method comprising:
providing at least one adapter within at least one component bay of the data storage library;
connecting at least one of an external environmental conditioning unit and an external environmental conditioning device to the at least one adapter;
providing conditioned air from the at least one adapter into an interior of the data storage library; and
determining at least one environmental condition within at least one of the at least one adapter and the data storage library, and determining if the at least one environmental condition within at least one of the at least one adapter and the data storage library is within a desired range of at least one selected environmental condition within the data storage library.

14. The method of claim 13, wherein providing at least one adapter comprises providing at least one duct adapter fluidly connected to the at least one external environmental conditioning unit via at least one duct.

15. The method of claim 14, further comprising generating positive pressure within the interior of the data storage library by fluidly connecting only one or more supply ducts to the environmental conditioning unit.

16. The method of claim 13, wherein providing at least one adapter comprises providing at least one environmental device adapter fluidly connected to the at least one external environmental conditioning device via at least one refrigerant line.

17. The method of claim 13, further comprising maintaining the at least one environmental condition within the data storage library if the determined at least one environmental condition within at least one of the at least one adapter and the data storage library is within the desired range of the at least one selected environmental condition within the data storage library.

* * * * *